(12) United States Patent
Kang et al.

(10) Patent No.: US 7,846,790 B2
(45) Date of Patent: Dec. 7, 2010

(54) METHOD OF FABRICATING SEMICONDUCTOR DEVICE HAVING MULTIPLE GATE DIELECTRIC LAYERS AND SEMICONDUCTOR DEVICE FABRICATED THEREBY

(75) Inventors: Sung-Gun Kang, Suwon-si (KR); Kang-Soo Chu, Yongni-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 405 days.

(21) Appl. No.: 11/877,262

(22) Filed: Oct. 23, 2007

(65) Prior Publication Data
US 2008/0099856 A1 May 1, 2008

(30) Foreign Application Priority Data
Oct. 25, 2006 (KR) ............... 10-2006-0104118

(51) Int. Cl.
*H01L 21/8242* (2006.01)
(52) U.S. Cl. .................. 438/242; 257/392; 257/E21.54
(58) Field of Classification Search ................ 438/242; 257/392, E21.54
See application file for complete search history.

(56) References Cited

U.S. PATENT DOCUMENTS

| 6,090,652 | A * | 7/2000 | Kim ........................... 438/228 |
| 6,339,001 | B1 * | 1/2002 | Bronner et al. ............. 438/275 |
| 6,403,425 | B1 | 6/2002 | Ang et al. |
| 6,406,977 | B2 | 6/2002 | Dickerson et al. |
| 6,524,910 | B1 * | 2/2003 | Lin et al. ..................... 438/257 |
| 2006/0216885 | A1 * | 9/2006 | Lee ............................. 438/243 |

FOREIGN PATENT DOCUMENTS

| JP | 2001-267409 | 9/2001 |
| JP | 2005-026357 | 1/2005 |
| KR | 1020010037460 A | 7/2001 |
| KR | 1020020083807 A | 11/2002 |
| KR | 1020030091284 A | 12/2003 |
| KR | 1020040046072 A | 6/2004 |

OTHER PUBLICATIONS

Korean Notice of Allowability issued on Dec. 31, 2007.

* cited by examiner

*Primary Examiner*—Thao X Le
*Assistant Examiner*—Matthew Gordon
(74) *Attorney, Agent, or Firm*—F. Chau & Associates, LLC

(57) ABSTRACT

A method of fabricating a semiconductor device having multiple gate dielectric layers and a semiconductor device fabricated thereby, in which the method includes forming an isolation layer defining first and second active regions in a semiconductor substrate. A passivation layer is formed on the substrate having the isolation layer. A first patterning process is carried out that etches the passivation layer on the first active region to form a first opening exposing the first active region, and a first dielectric layer is formed in the exposed first active region. A second patterning process is carried out, which etches the passivation layer on the second active region to form a second opening exposing the second active region, and a second dielectric layer is formed in the exposed second active region.

16 Claims, 20 Drawing Sheets

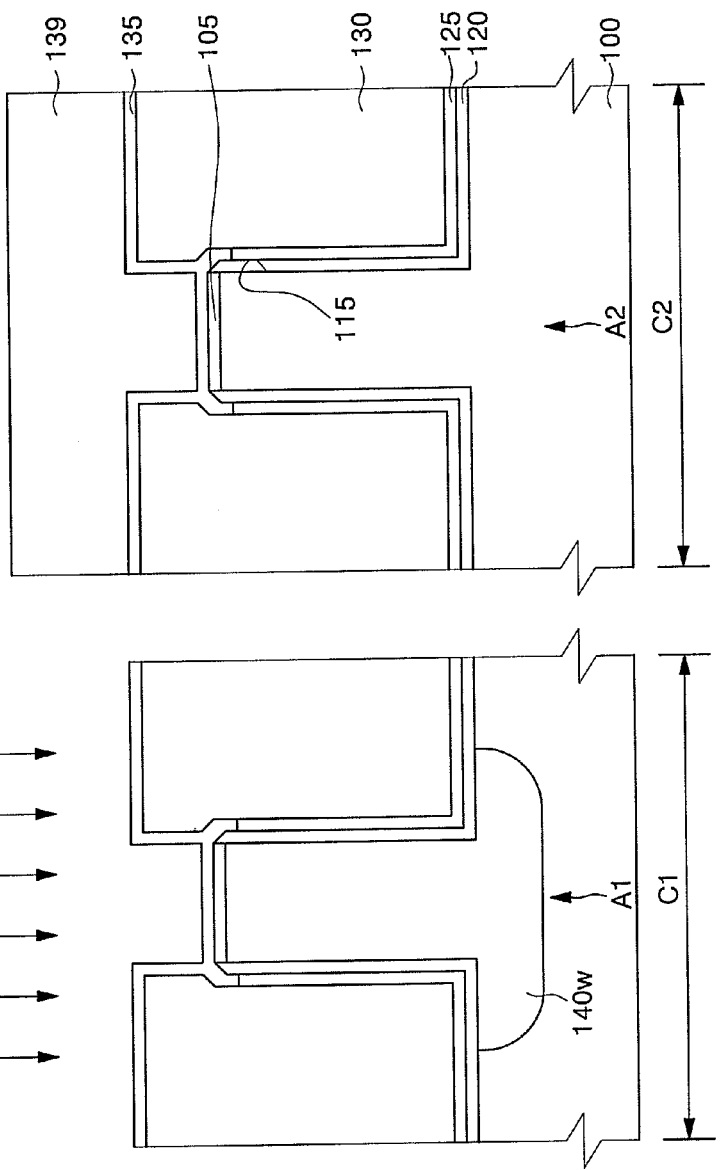

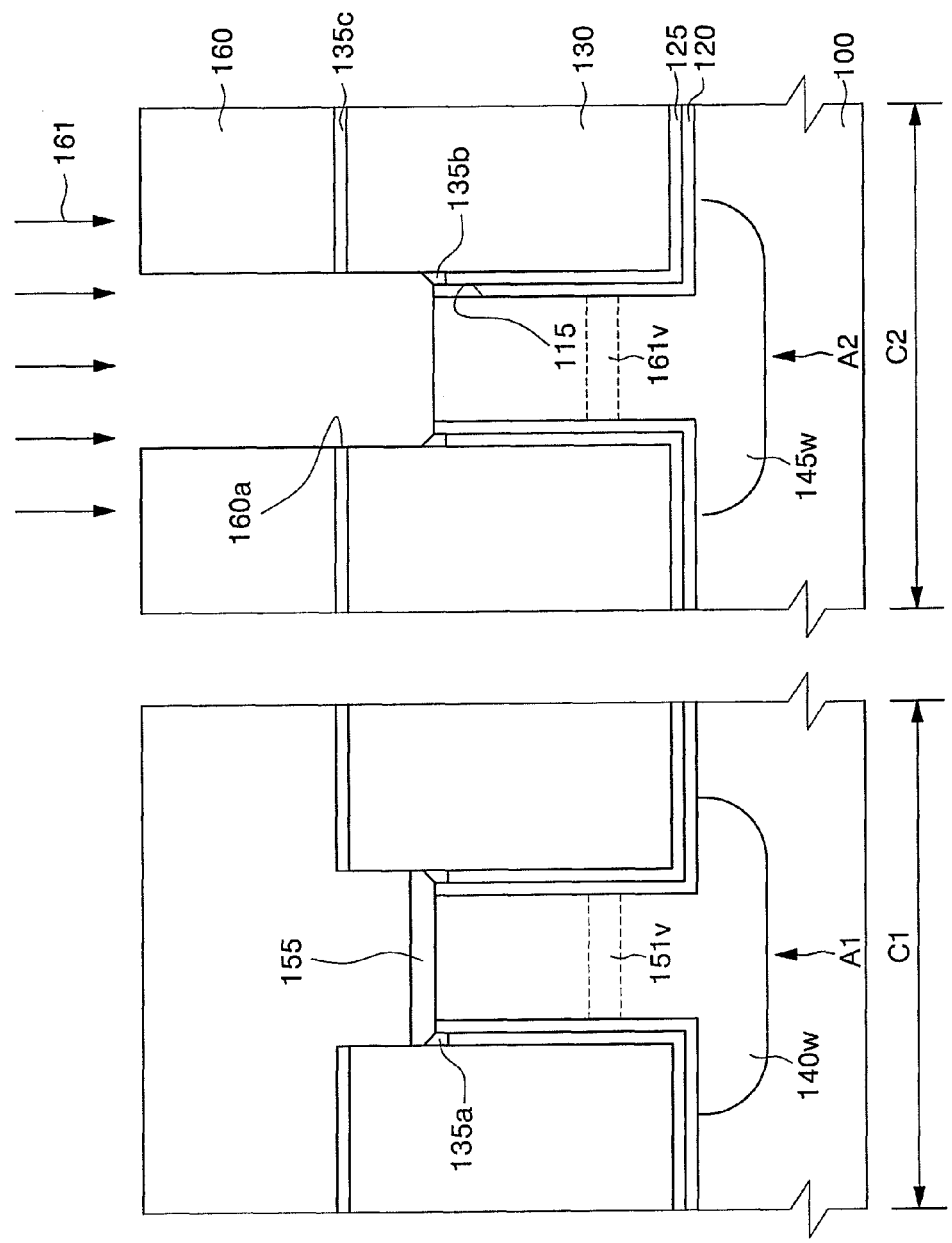

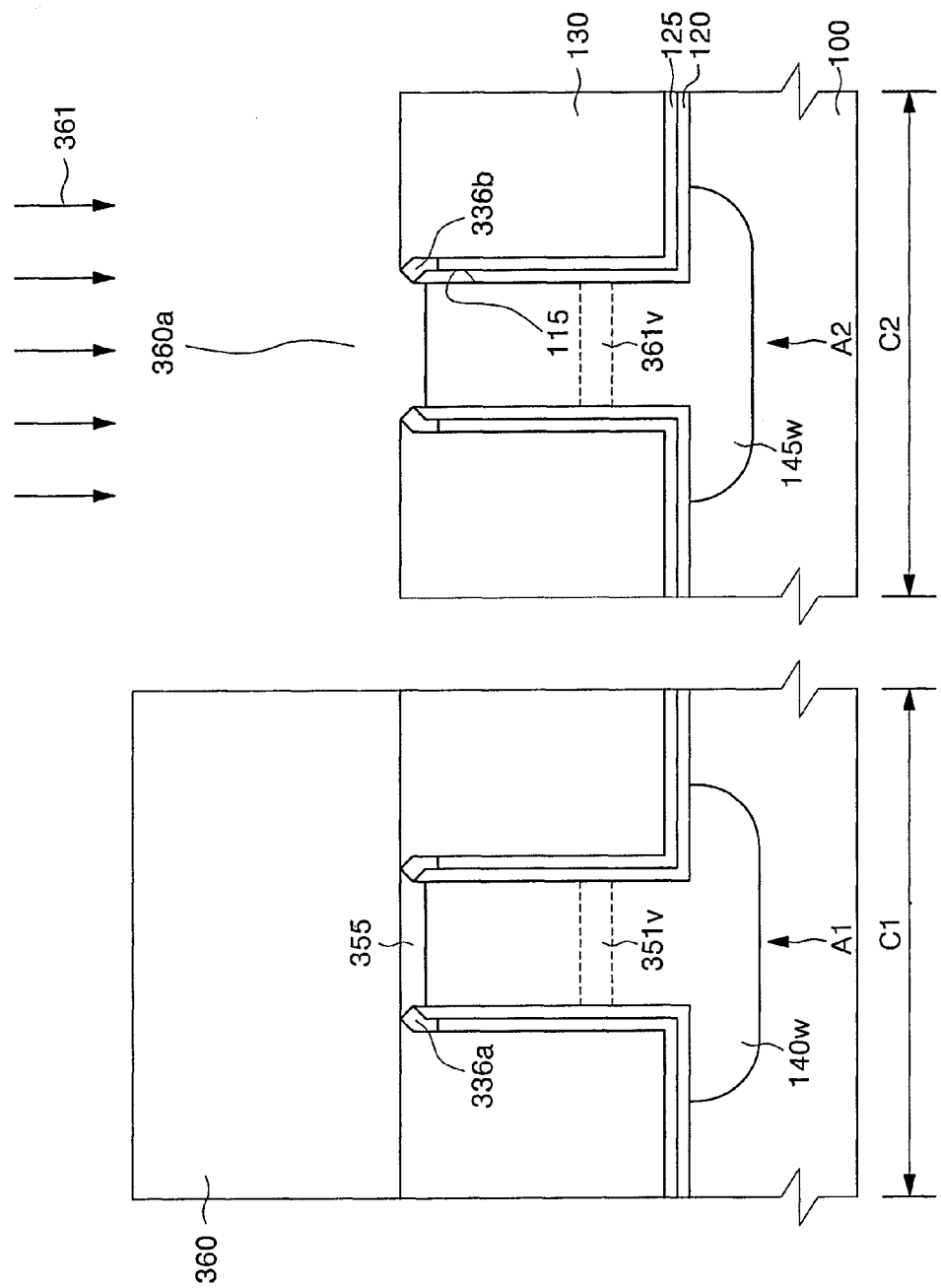

METHOD OF FABRICATING SEMICONDUCTOR DEVICE HAVING MULTIPLE GATE DIELECTRIC LAYERS AND SEMICONDUCTOR DEVICE FABRICATED THEREBY

CROSS-REFERENCE TO RELATED APPLICATION

This application claims the benefit of Korean Patent Application No. 10-2006-0104118, filed on Oct. 25, 2006, the contents of which are hereby incorporated herein by reference in their entirety.

BACKGROUND OF THE INVENTION

1. Technical Field

The present disclosure relates to a semiconductor device and, more particularly, to a method of fabricating a semiconductor device having multiple gate dielectric layers and a semiconductor device fabricated thereby.

2. Discussion of Related Art

As semiconductor devices are applied for use in various fields, device characteristics required for specific products also cover a wide range. To meet such demands, the necessity of a system-on-chip (SOC) where a memory and a logic circuit are incorporated in one chip has been recently increasing. Representative examples of the chip may include a Merged DRAM & Logic (MDL) device where a DRAM region and a logic region are merged, and a Merged Flash & Logic (MFL) device, where a flash memory region and a logic region are merged.

It is necessary to form a gate dielectric layer having various thicknesses in order to form devices having different operating voltages within a single chip. For example, in the case of an MDL device, a relatively thick gate dielectric layer should be formed because a high voltage is applied to the gate dielectric layer in the DRAM region, whereas a relatively thin gate dielectric layer should be formed in the logic region where a fast operating speed is required. In addition, a gate dielectric layer having various thicknesses is required to have different operating voltages even in a chip composed of the same kind of devices. Accordingly, various techniques for forming dual gate dielectric layers or multiple gate dielectric layers that have different thicknesses on a In semiconductor substrate have been researched. For example, a method of forming multiple gate dielectric layers is disclosed in U.S. Pat. No. 6,403,425 B1 entitled "Dual gate oxide process with reduced thermal distribution of thin-gate channel implant profiles due to thick-gate oxide."

FIGS. 1A to 1D are cross-sectional views illustrating a method of fabricating a conventional semiconductor device having multiple gate dielectric layers. Referring to FIGS. 1A to 1D, reference symbol "H" denotes a high-voltage MOS transistor region, and reference symbol "L" denotes a low-voltage MOS transistor region.

Referring to FIG. 1A, a pad oxide layer 5 and a hard mask 10 may be sequentially stacked on a first active region 3a in a high-voltage MOS transistor region H of a semiconductor substrate 1 and on a second active region 3b in the low-voltage MOS transistor region L of the semiconductor substrate 1. The pad oxide layer 5 may be formed of a thermal oxide layer, and the hard mask 10 may be formed of a silicon nitride layer.

The semiconductor substrate 1 may be etched using the hard mask 10 as an etch mask to form a trench 15. Subsequently, an isolation layer 20 filling the trench 15 may be formed. The isolation layer 20 may be formed of a silicon oxide layer by a chemical vapor deposition (CVD) method.

Referring to FIG. 1B, the hard mask (10 of FIG. 1A) may be removed. Subsequently, the pad oxide layer (5 of FIG. 1A) may be removed. The pad oxide layer (5 of FIG. 1A) may be etched by a wet etching process to expose the first active region 3a and the second active region 3b. The pad oxide layer (5 of FIG. 1A), however, is a thermal oxide layer, and the isolation layer 20 is a silicon oxide layer formed by CVD, so that the isolation layer 20 can be etched faster than the pad oxide layer (5 of FIG. 1A). As a result, first recessed regions D1, that is, dent regions, are formed in upper edge regions of the isolation layers 20.

Subsequently, the semiconductor substrate having the first recessed regions D1 is thermally oxidized to form a first gate oxide layer 25 on each of the exposed first and second active regions 3a and 3b. The first gate oxide layers 25 remain while subsequent processes are carried out, and act as a gate dielectric layer of a high-voltage MOS transistor. As the thickness of the first gate oxide layer 25 increases during the thermal oxidation, the thickness of the portion of first gate oxide layer 25 on the upper corner of the first active region 3a becomes relatively smaller. Such a phenomenon is referred to as a thinning effect.

Referring to FIG. 1C, a photoresist pattern 30 having an opening exposing the low-voltage MOS transistor region L may be formed on the substrate having the first gate oxide layers 25. The first gate oxide layer 25 in the low-voltage MOS transistor region L is then wet-etched using the photoresist pattern 30 as an etch mask to expose the second active region 3b. As a result, second recessed regions D2 deeper than the first recessed regions D1 are formed in edge regions of the isolation layer 20 in the low-voltage MOS transistor region L.

Referring to FIG. 1D, the photoresist pattern 30 may be removed in the high-voltage MOS transistor region H. The semiconductor substrate having the second recessed regions D2 is then thermally oxidized to form a second gate oxide layer 35 that is thinner than the first gate oxide layer 25 on the second active region 3b. In this case, the first gate oxide layer 25 on the first active region 3a is barely grown. Accordingly, the first gate oxide layer 25 has almost the same thickness as its initial thickness. But even so, the first recessed regions D1 still remain in the edge regions of the isolation layer 20 in the high-voltage MOS transistor region H, and the second recessed regions D2 deeper than the first recessed regions D1 remain in the edge regions of the isolation layer 20 in the low-voltage MOS transistor region L.

A gate conductive layer is formed on the entire surface of the semiconductor substrate having the second gate oxide layer 35. The gate conductive layer is patterned to form a high-voltage gate electrode 40a crossing over the first active region 3a and a low-voltage gate electrode 40b crossing over the second active region 3b. Consequently, the first gate oxide layer 25 acts as a gate dielectric layer of the high-voltage MOS transistor, and the second gate oxide layer 35 acts as a gate dielectric layer of the low-voltage MOS transistor.

According to the conventional art as described above, the first recessed regions D1 are formed in the edge regions of the isolation layer in the high-voltage MOS transistor region, and the second recessed regions D2 deeper than the first recessed regions D1 are formed in the edge regions of the isolation layer in the low-voltage MOS transistor region. Accordingly, the subthreshold characteristics of the high-voltage MOS transistor, as well as the subthreshold characteristics of the low-voltage MOS transistor, are significantly deteriorated.

Because the thickness of the first gate dielectric layer 25 covering the edge corner of the first active region 3a is relatively smaller than the thickness of the first gate dielectric layer 25 formed on a center portion of the first active region 3a, a breakdown voltage of the gate dielectric layer of the high-voltage MOS transistor significantly decreases. Consequently, the reliability of the high-voltage MOS transistor is deteriorated. In addition, the second recessed regions D2 may expose upper sidewalls of the second active region 3b. As a result, the thickness of the second gate dielectric layer 35 covering the upper edge corner of the second active region 3b is relatively smaller than the thickness of the second gate dielectric layer 35 formed on a center portion of the second active region 3b. Accordingly, the MOS transistor may be turned on at a voltage lower than a threshold voltage, that is, a reverse narrow width effect may occur.

SUMMARY OF THE INVENTION

An exemplary embodiment of the present invention provides a method of fabricating a semiconductor device that can prevent dent regions from being formed in upper edge regions of an isolation layer while forming multiple gate dielectric layers.

An exemplary embodiment of the present invention provides a semiconductor device that can prevent hump and reverse narrow width effect from occurring.

In accordance with an exemplary embodiment, the present invention is directed to a method of fabricating a semiconductor device having multiple gate dielectric layers. The method comprises forming an isolation layer defining first and second active regions in a semiconductor substrate, and a passivation layer is formed on the substrate having the isolation layer. A first patterning process is carried out, which etches the passivation layer on the first active region to form a first opening exposing the first active region, and a first dielectric layer is formed in the exposed first active region. A second patterning process is carried out, which etches the passivation layer on the second active region to form a second opening exposing the second active region, and a second dielectric layer is formed in the exposed second active region.

In exemplary embodiments of the present invention, the passivation layer may be formed of a material having an etch selectivity with respect to the isolation layer.

In exemplary embodiments, the second patterning process may be carried out after the first dielectric layer is formed.

In accordance with exemplary embodiments, the first dielectric layer may be formed to have a first thickness on the first active region, and the second dielectric layer may be formed on the second active region to have a second thickness smaller than the first thickness.

In exemplary embodiments, the first dielectric layer may be formed of a thermal oxide layer by thermal oxidation, or may be formed of a first high-k dielectric layer by chemical vapor deposition (CVD) or atomic layer deposition (ALD). The second dielectric layer may be formed of a thermal oxide layer by thermal oxidation, or may be formed of a second high-k dielectric layer by CVD or ALD. When the second dielectric layer is formed of the second high-k dielectric layer, the second dielectric layer may cover not only the exposed surface of the second active region but also the surface of the first dielectric layer.

In exemplary embodiments, before the first patterning process is carried out, at least one of a well ion implantation process and an ion implantation process for adjusting the threshold voltage may be carried out on each of the first and second active regions.

In accordance with exemplary embodiments, the second patterning process may comprise forming a photoresist pattern opening an upper portion of the second active region on the substrate having the first dielectric layer; etching the passivation layer using the photoresist pattern as an etch mask; and removing the photoresist pattern.

Before the photoresist pattern is removed, an ion implantation for adjusting the threshold voltage may be carried out on the second active region using the photoresist pattern as an ion implantation mask.

An exemplary embodiment of the present invention is directed to a method of fabricating a semiconductor device that can prevent dent regions from being formed in upper edge regions of an isolation layer while forming multiple gate dielectric layers. The method comprises forming a hard mask on first and second circuit regions of a semiconductor substrate. The semiconductor substrate is etched using the hard mask as an etch mask to form a trench region. A first active region of the first circuit region and a second active region of the second circuit region are defined by the trench region. An insulating liner is formed to cover an inner wall of the trench region, and an isolation layer is formed on the substrate having the insulating liner to fill the trench region. The hard mask is removed, and a portion of the insulating liner is etched to form a first recessed region between the isolation layer and the first active region and a second recessed region between the isolation layer and the second active region while the hard mask is removed. A passivation layer is formed on the substrate having the first and second recessed regions to fill the first and second recessed regions. A first patterning process of etching the passivation layer on the first active region is carried out to form a first opening exposing the first active region. The first patterning process allows the passivation layer to remain in the first recessed region to form a first passivation pattern. A first dielectric layer is formed in the exposed first active region. A second patterning process of etching the passivation layer on the second active region is carried out to form a second opening exposing the second active region. The second patterning process allows the passivation layer to remain in the second recessed region to form a second passivation pattern. A second dielectric layer is formed in the exposed second active region.

In exemplary embodiments of the present invention, before the insulating liner is formed, the method may further comprise forming a buffer insulating layer covering an inner wall of the trench region.

According to exemplary embodiments, the first dielectric layer may be formed on the first active region to have a first thickness, and the second dielectric layer may be formed on the second active region to have a second thickness smaller than the first thickness.

In exemplary embodiments, the first dielectric layer may be a thermal oxide layer formed by thermal oxidation, or may be a first high-k dielectric layer formed by CVD or ALD. The second dielectric layer may be a thermal oxide layer formed by thermal oxidation, or may be a second high-k dielectric layer formed by CVD or ALD. When the second dielectric layer is formed of the second high-k dielectric layer, the second dielectric layer may cover not only the exposed surface of the second active region but also the surface of the first dielectric layer.

According to exemplary embodiments, before the first patterning process is carried out, the method may further comprise carrying out at least one of a well ion implantation process and an ion implantation process for adjusting the threshold voltage on each of the first and second active regions.

In exemplary embodiments, the first patterning process may comprise forming a first photoresist pattern opening the first circuit region on the passivation layer; anisotropically etching the passivation layer on the first circuit region using the first photoresist pattern as an etch mask to form a first sidewall spacer, the first sidewall spacer filling the first recessed region and covering a sidewall of a protrusion of the isolation layer formed at a level higher than the first active region; partially etching the isolation layer using the first photoresist pattern and the first sidewall spacer as etch masks while cleaning the surface of the first active region; etching the first sidewall spacer such that the first sidewall spacer remains in the first recessed region; and removing the first photoresist pattern.

According to exemplary embodiments, the second patterning process may comprise forming a second photoresist pattern opening an upper portion of the second active region on the substrate having the first dielectric layer; etching the passivation layer on the second active region using the second photoresist pattern as an etch mask such that the passivation layer remains in the second recessed region; and removing the second photoresist pattern.

In addition, before the second photoresist pattern is removed, the method may further comprise implanting ions for adjusting the threshold voltage into the second active region using the second photoresist pattern as an ion implantation mask.

According to exemplary embodiments, the second patterning process may comprise forming a second photoresist pattern opening the second circuit region on the substrate having the first dielectric layer; anisotropically etching the passivation layer on the second circuit region using the second photoresist pattern as an etch mask to form a second sidewall spacer, the second sidewall spacer filling the second recessed region and covering a sidewall of a protrusion of the isolation layer formed at a level higher than the second active region; partially etching the isolation layer using the second photoresist pattern and the second sidewall spacer as etch masks while cleaning the surface of the second active region; etching the second sidewall spacer such that the second sidewall spacer remains in the second recessed region; and removing the second photoresist pattern.

Exemplary embodiments of the present invention are directed to a semiconductor device having multiple gate dielectric layers. The semiconductor device comprises an isolation layer disposed in a semiconductor substrate and defining first and second active regions. First and second passivation patterns are interposed between an upper region of the first active region and the isolation layer, and between an upper region of the second active region and the isolation layer, respectively. A first gate dielectric layer is disposed on the first active region. A second gate dielectric layer having a thickness smaller than the first gate dielectric layer is disposed on the second active region.

In exemplary embodiments of the present invention, the semiconductor device may further comprise an insulating liner disposed at a level lower than the first and second passivation patterns and interposed between the isolation layer and the first and second active regions.

The semiconductor device may further comprise a buffer insulating layer interposed between the insulating liner and the first and second active regions, and between the first and second passivation patterns and the first and second active regions.

In exemplary embodiments, the isolation layer may be formed of a material layer having an etch rate different from the first and second passivation patterns.

According to exemplary embodiments, the semiconductor device may further comprise a third passivation pattern disposed on the isolation layer. The third passivation pattern may be formed of the same material as the first and second passivation patterns, and a material having an etch rate different from the isolation layer.

In exemplary embodiments, the first and second gate dielectric layers may be formed of a thermal oxide layer.

According to exemplary embodiments, the first gate dielectric layer may be composed of a first dielectric layer and a second dielectric layer that are sequentially stacked, and the second gate dielectric layer may be composed of the second dielectric layer. In this case, the first dielectric layer may be formed of a thermal oxide layer or a first high-k dielectric layer, and the second dielectric layer may be formed of a second high-k dielectric layer.

BRIEF DESCRIPTION OF THE DRAWINGS

Exemplary embodiments of the invention will be understood in more detail from the following descriptions taken in conjunction with the accompanying drawings.

FIGS. 2A to 2G are cross-sectional views illustrating a method of fabricating a semiconductor device in accordance with an exemplary embodiment of the present invention.

FIGS. 5A to 5D are cross-sectional views illustrating a method of fabricating a semiconductor device in accordance with an exemplary embodiment of the present invention.

DETAILED DESCRIPTION OF EXEMPLARY EMBODIMENTS

Figure 1A:
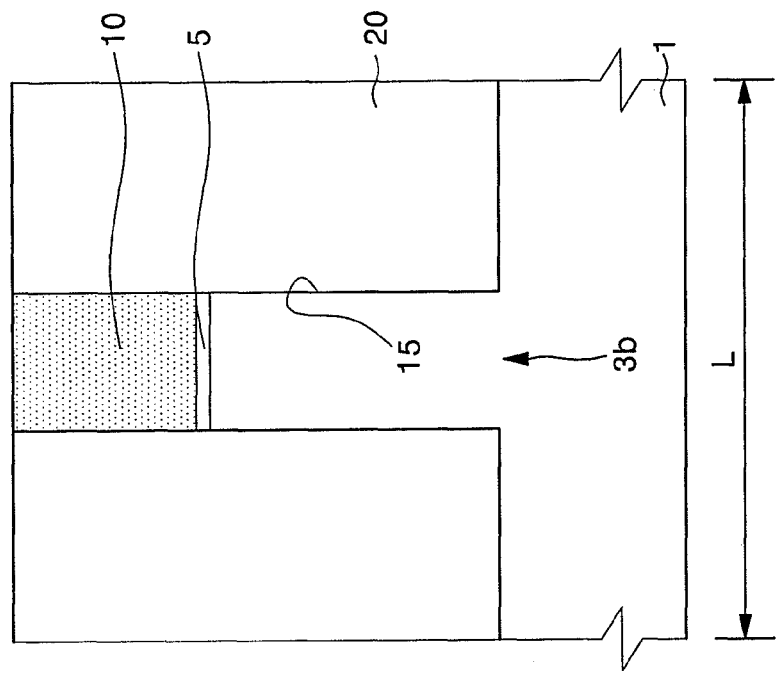
FIGS. 1A to 1D are cross-sectional views illustrating a conventional method of fabricating a semiconductor device.
Figure 1A:
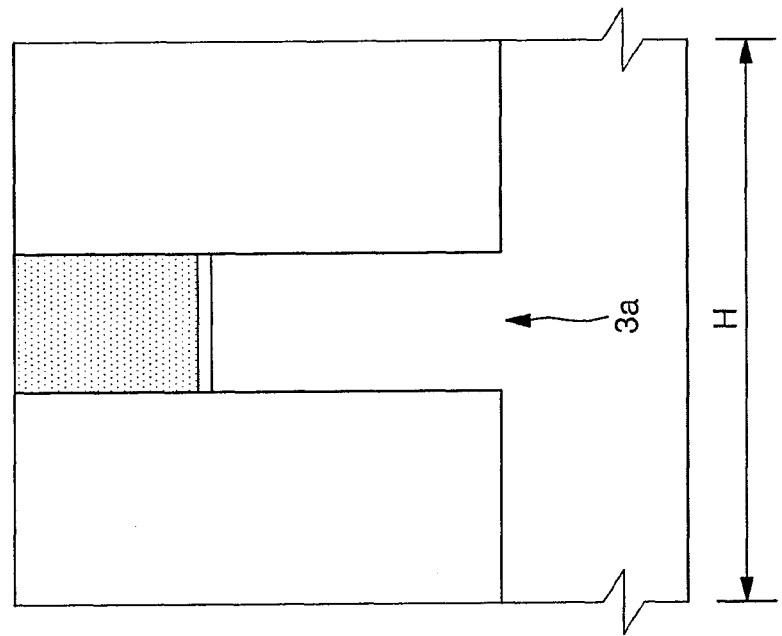
Figure 1B:
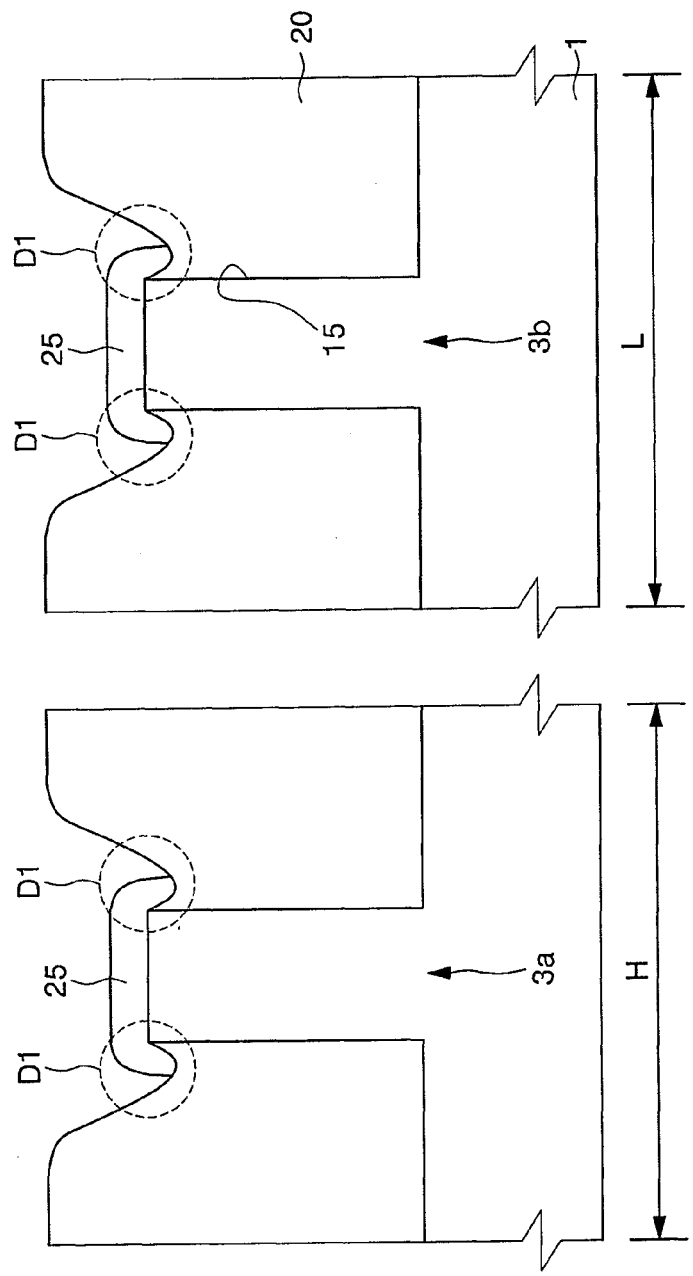
Figure 1C:
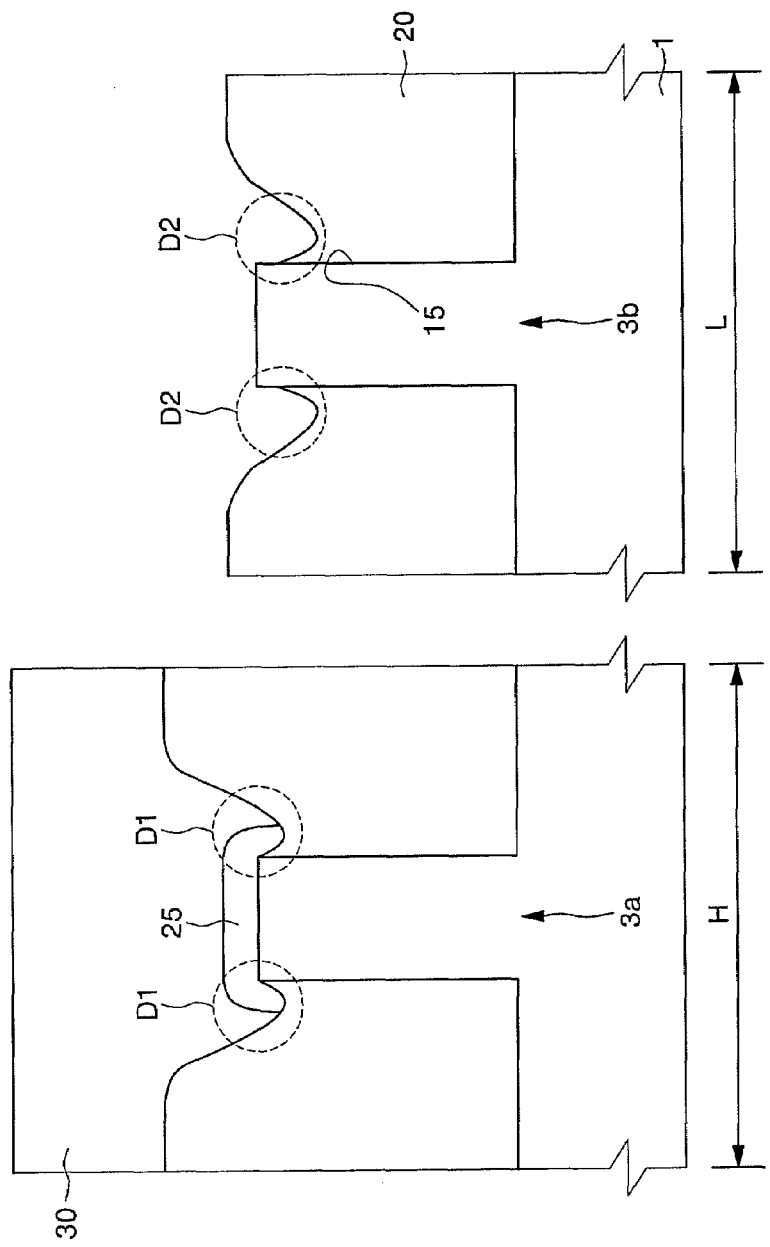
Figure 1D:
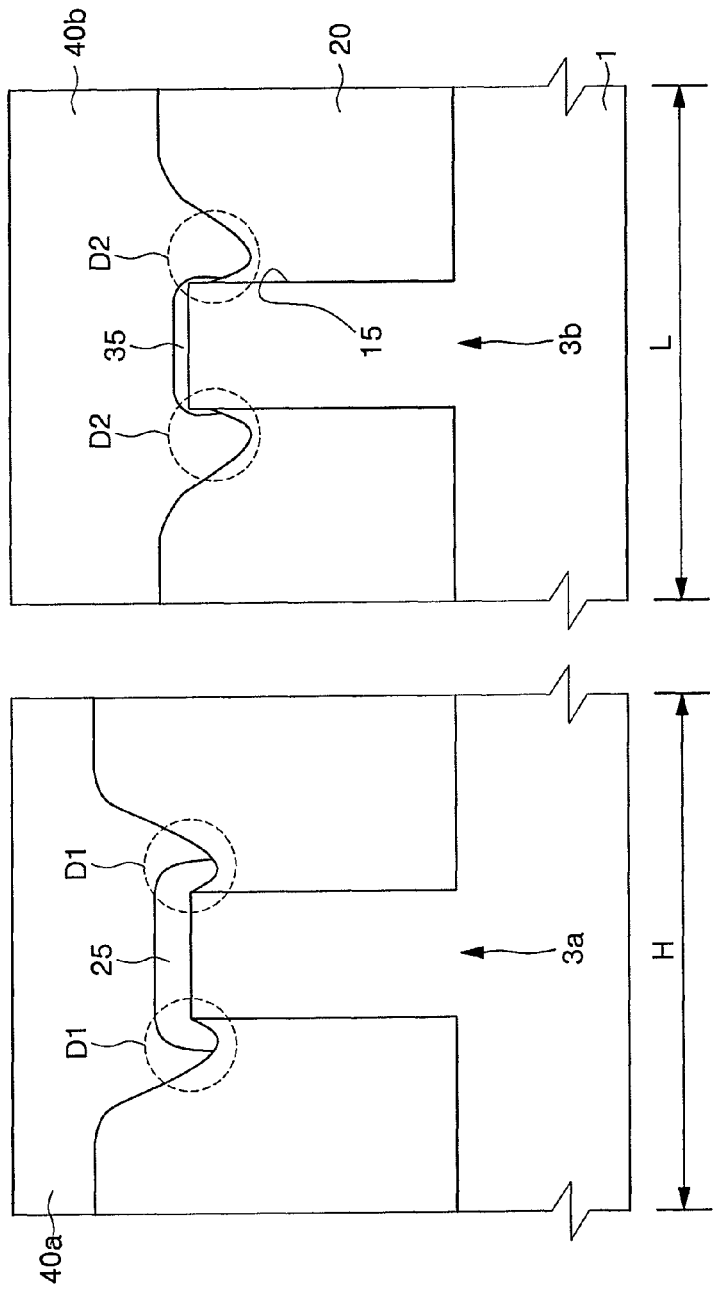

Exemplary embodiments of the present invention will now be described more fully hereinafter with reference to the accompanying drawings, in which embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those of ordinary skill in the art. In the drawings, like numbers refer to like elements throughout the specification.

Figure 2A:
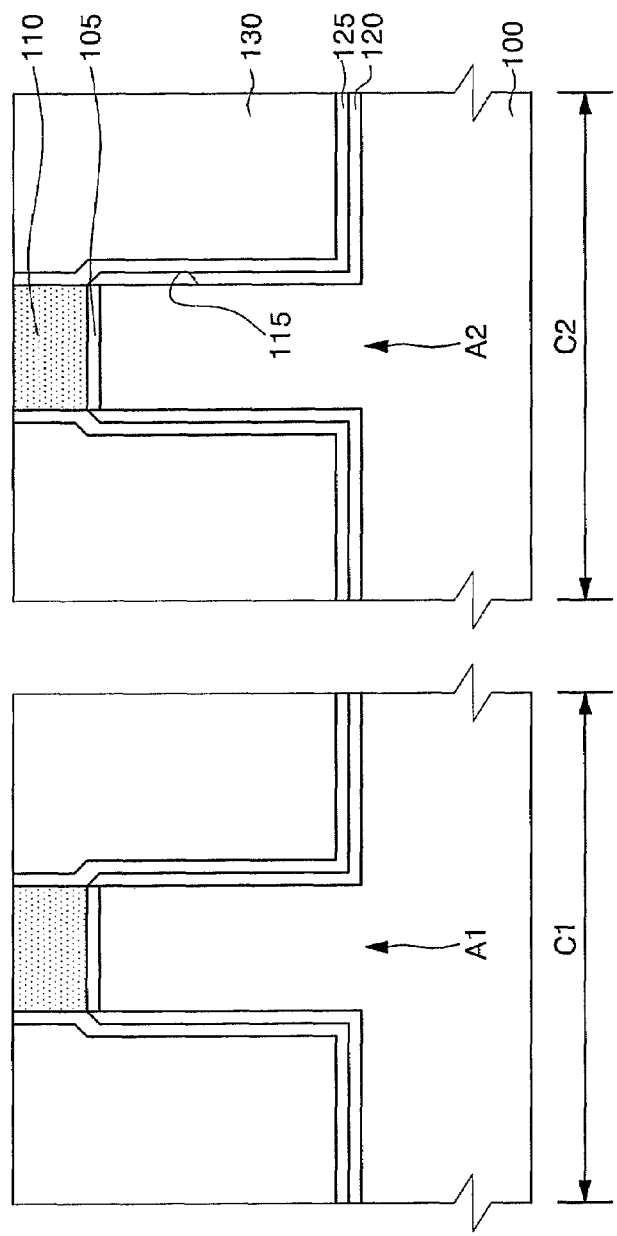
Figure 2B:
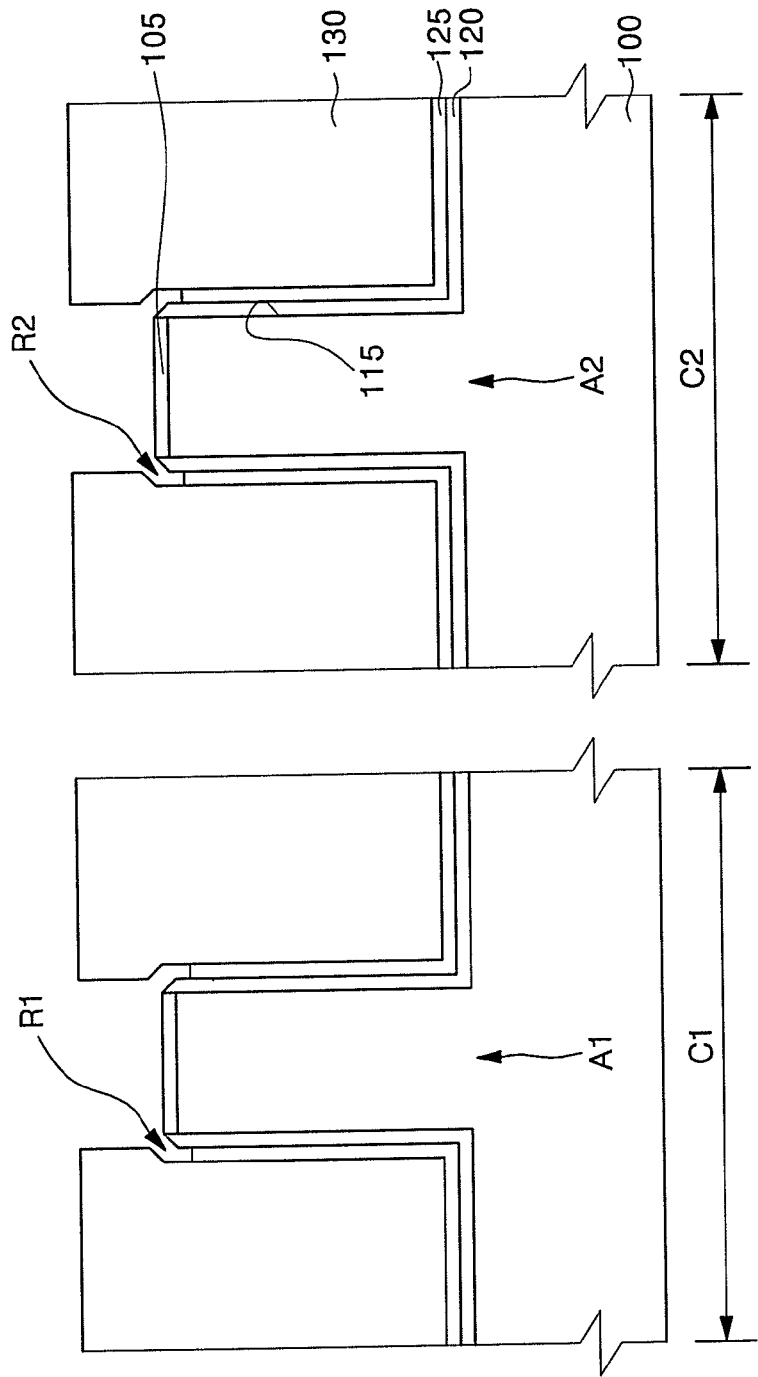
Figure 2D:
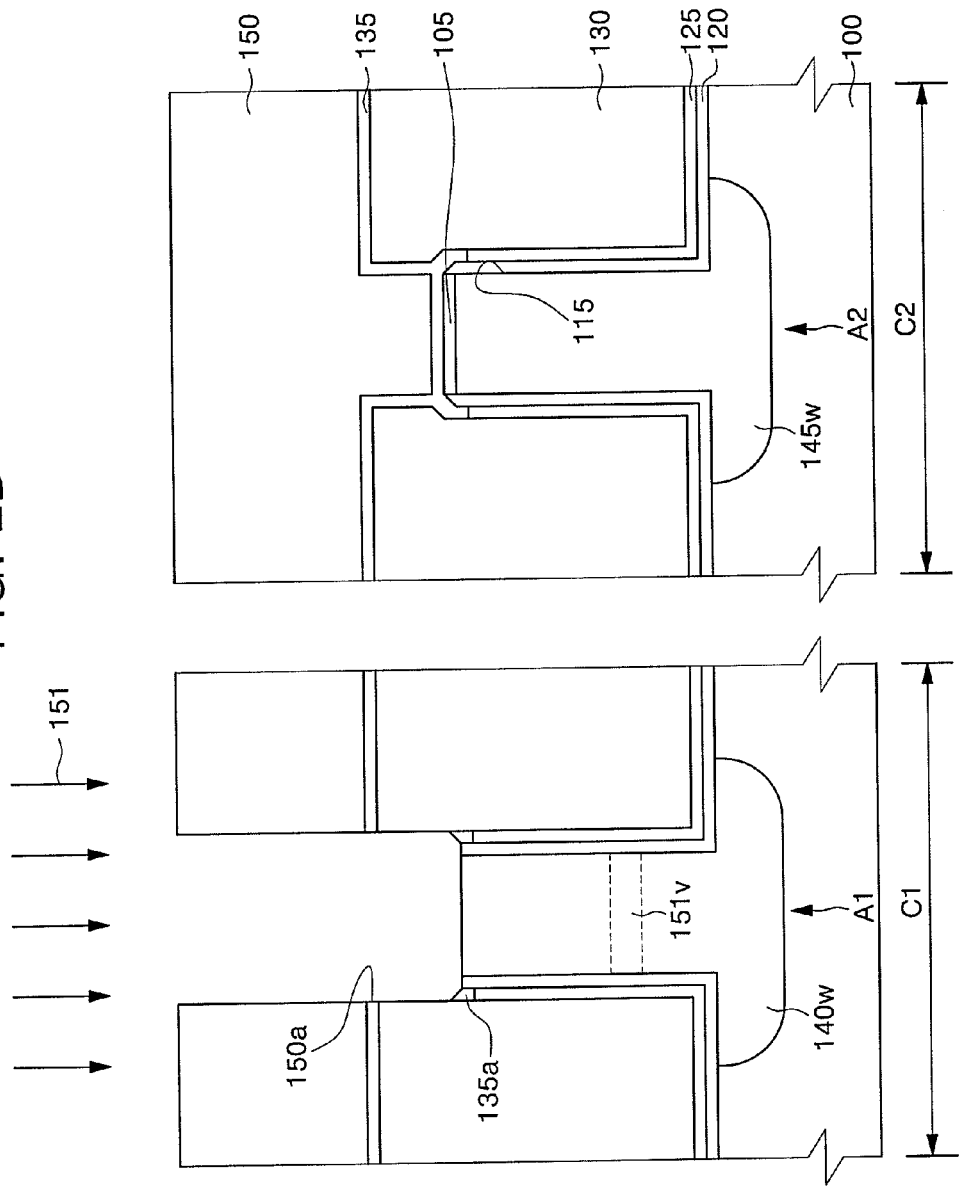
Figure 2E:
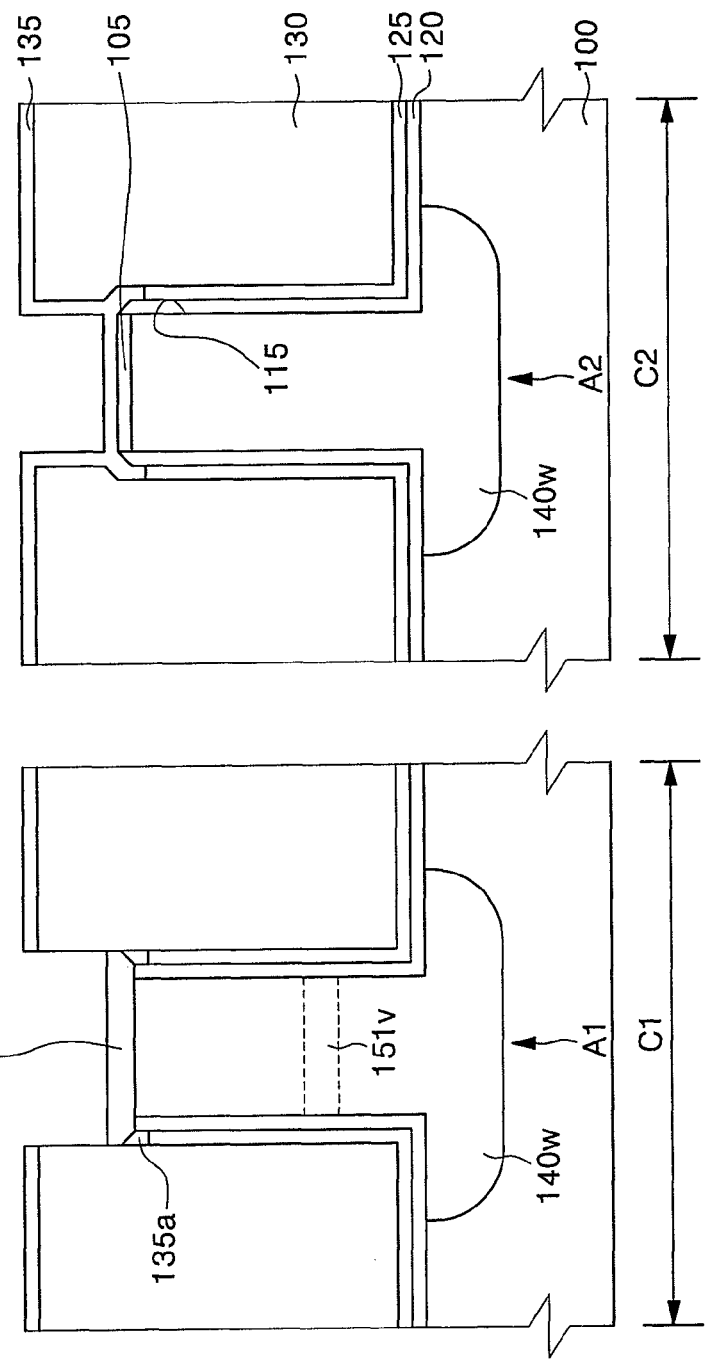
Figure 2G:
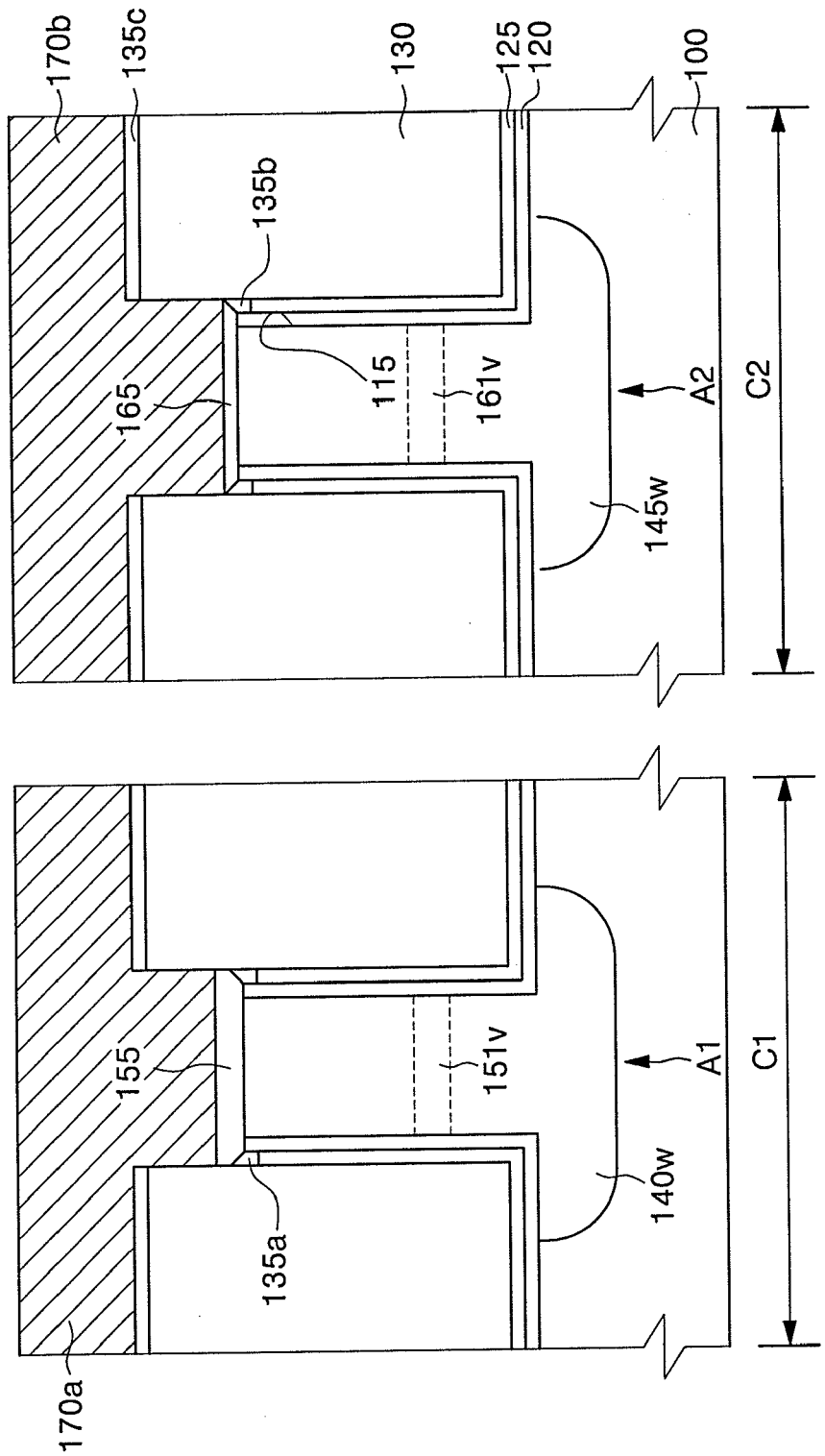
Figure 3:
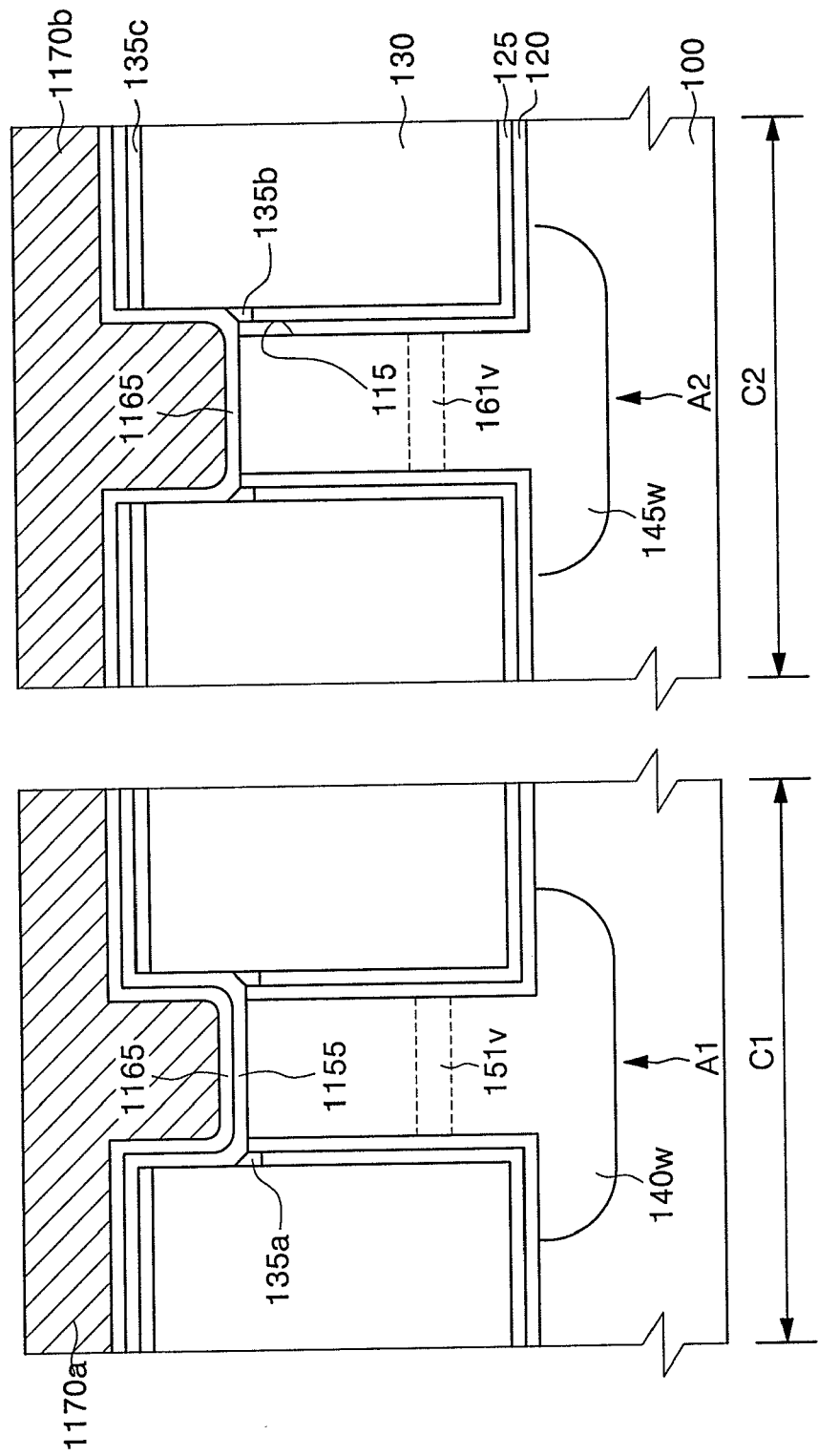
FIG. 3 is a cross-sectional view illustrating a method of fabricating a semiconductor device in accordance with an exemplary embodiment of the present invention.
Figure 4A:
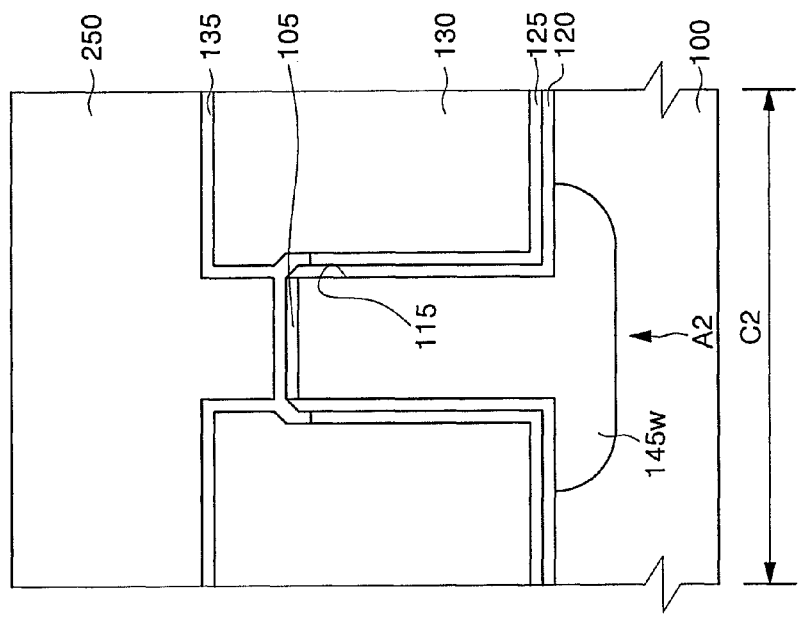
FIGS. 4A to 4C are cross-sectional views illustrating a method of fabricating a semiconductor device in accordance with an exemplary embodiment of the present invention.
Figure 4A:
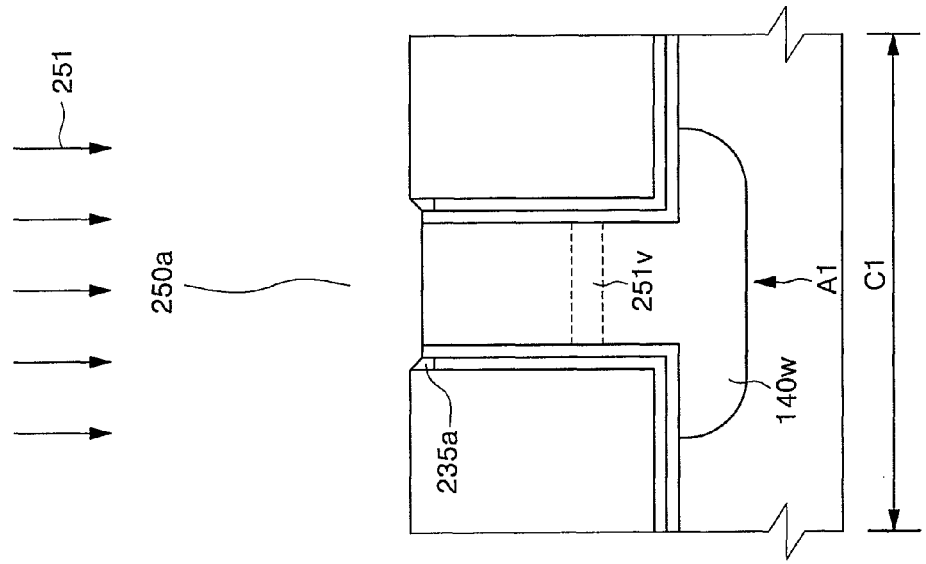
Figure 4B:
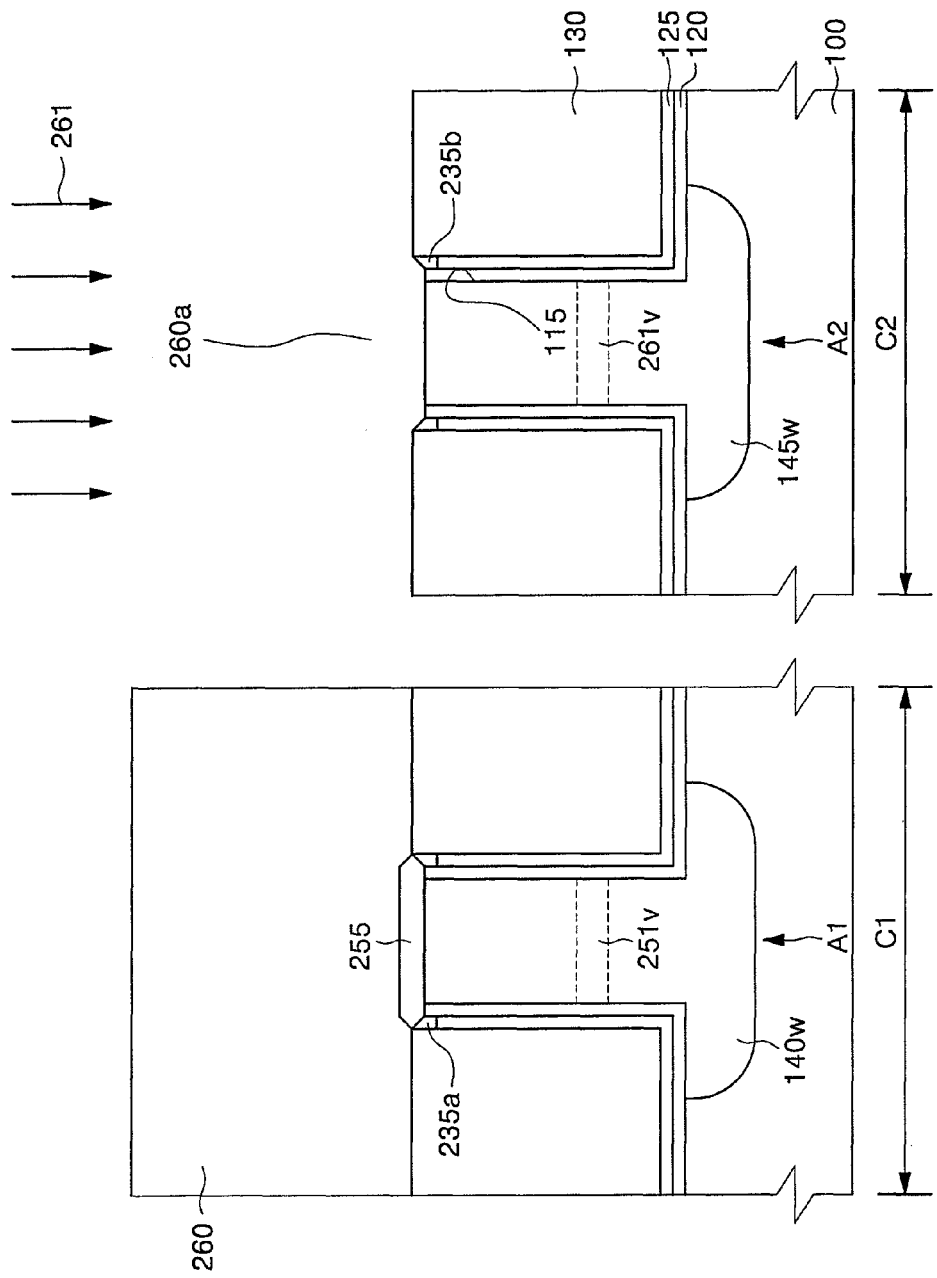
Figure 4C:
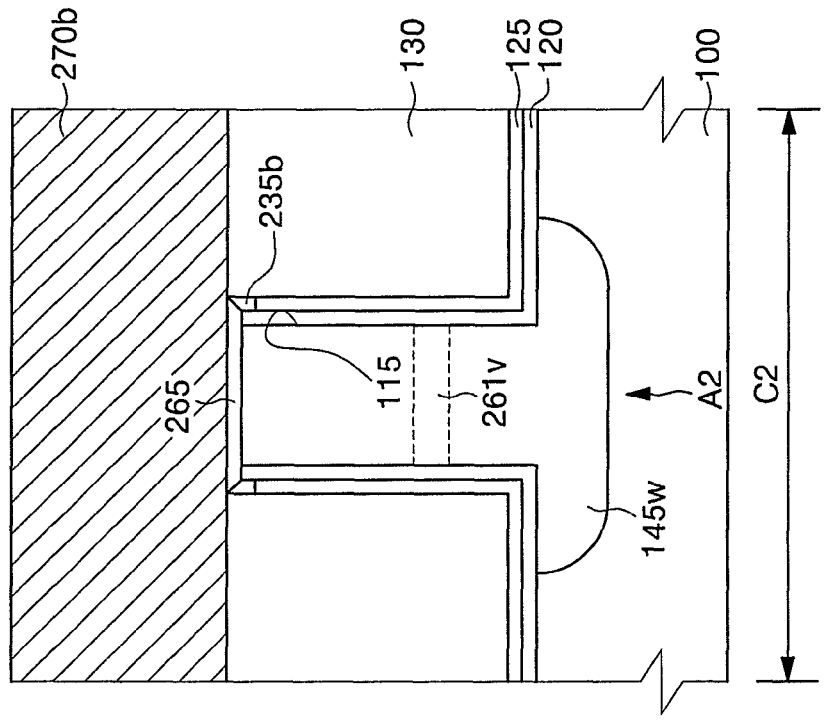
Figure 4C:
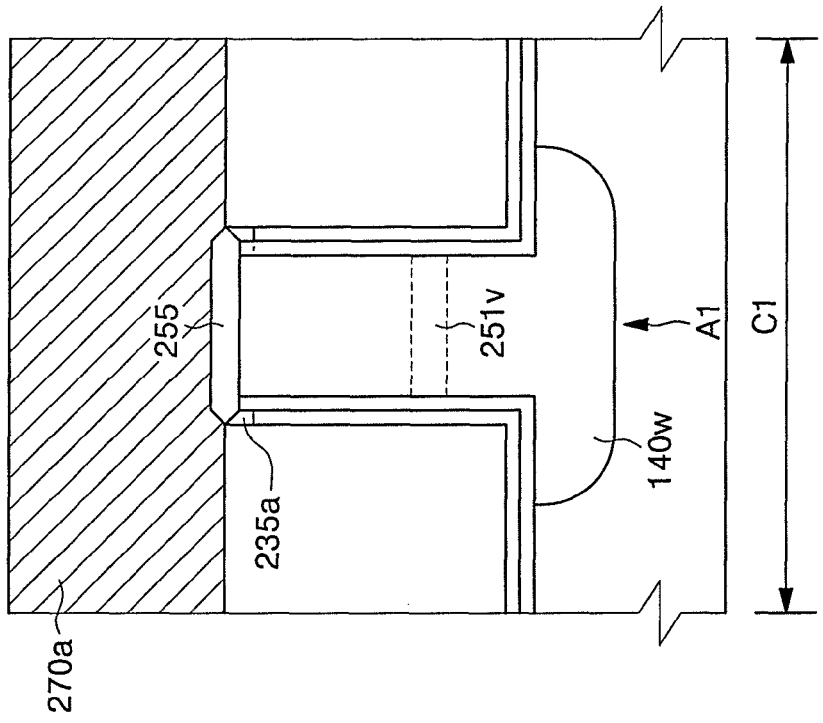
Figure 5A:
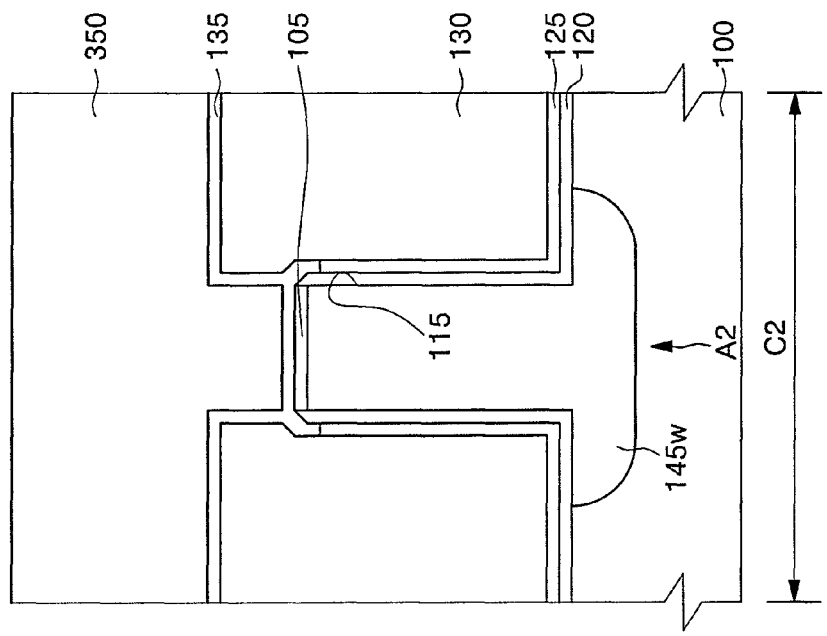
Figure 5A:
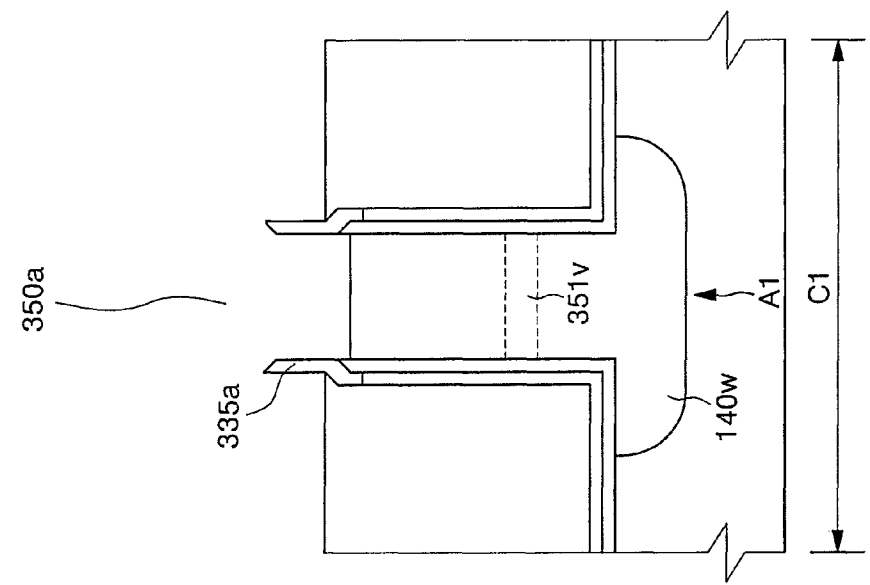
Figure 5B:
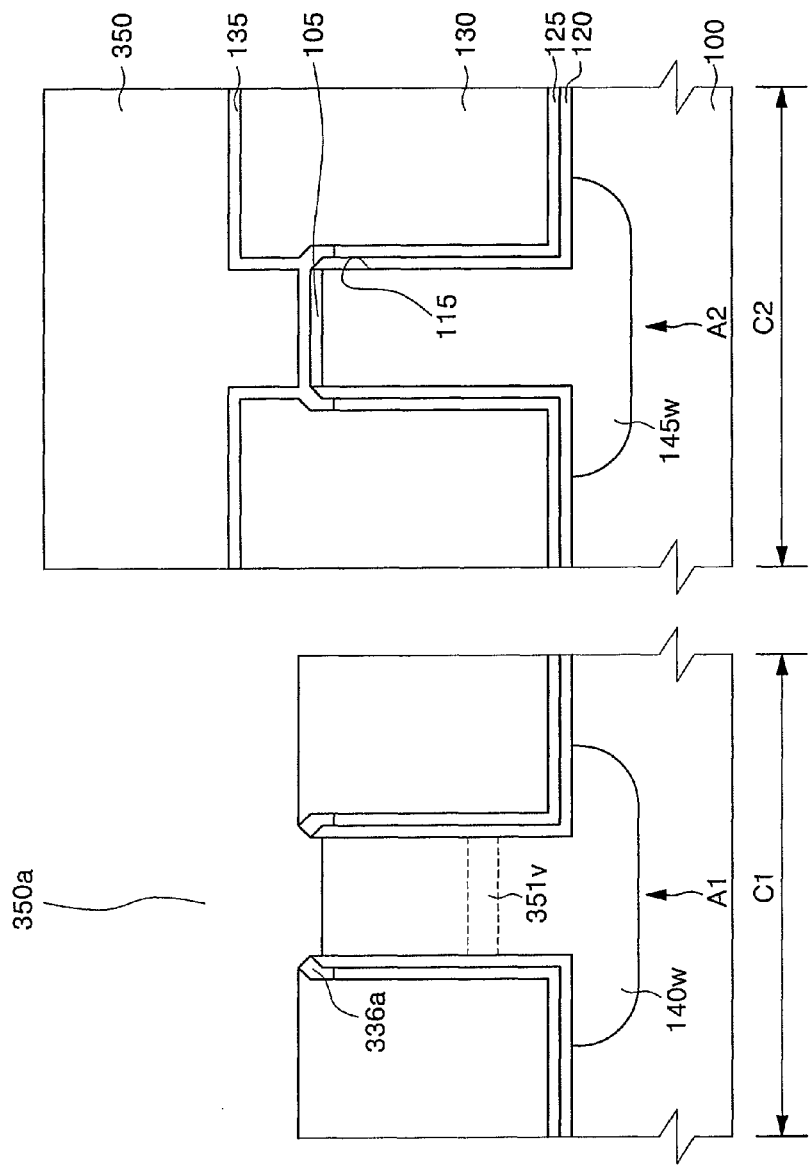
Figure 5D:
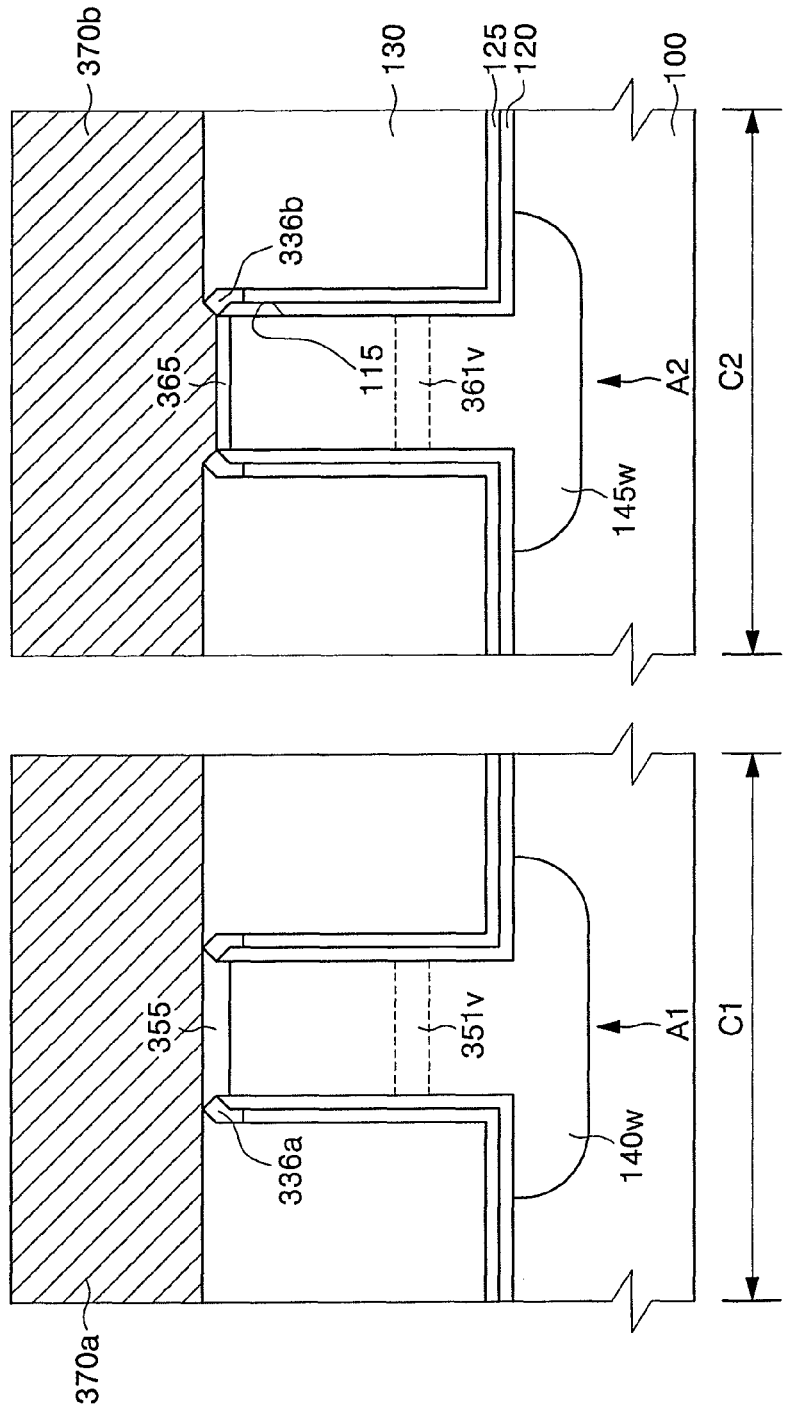
Figure 6:
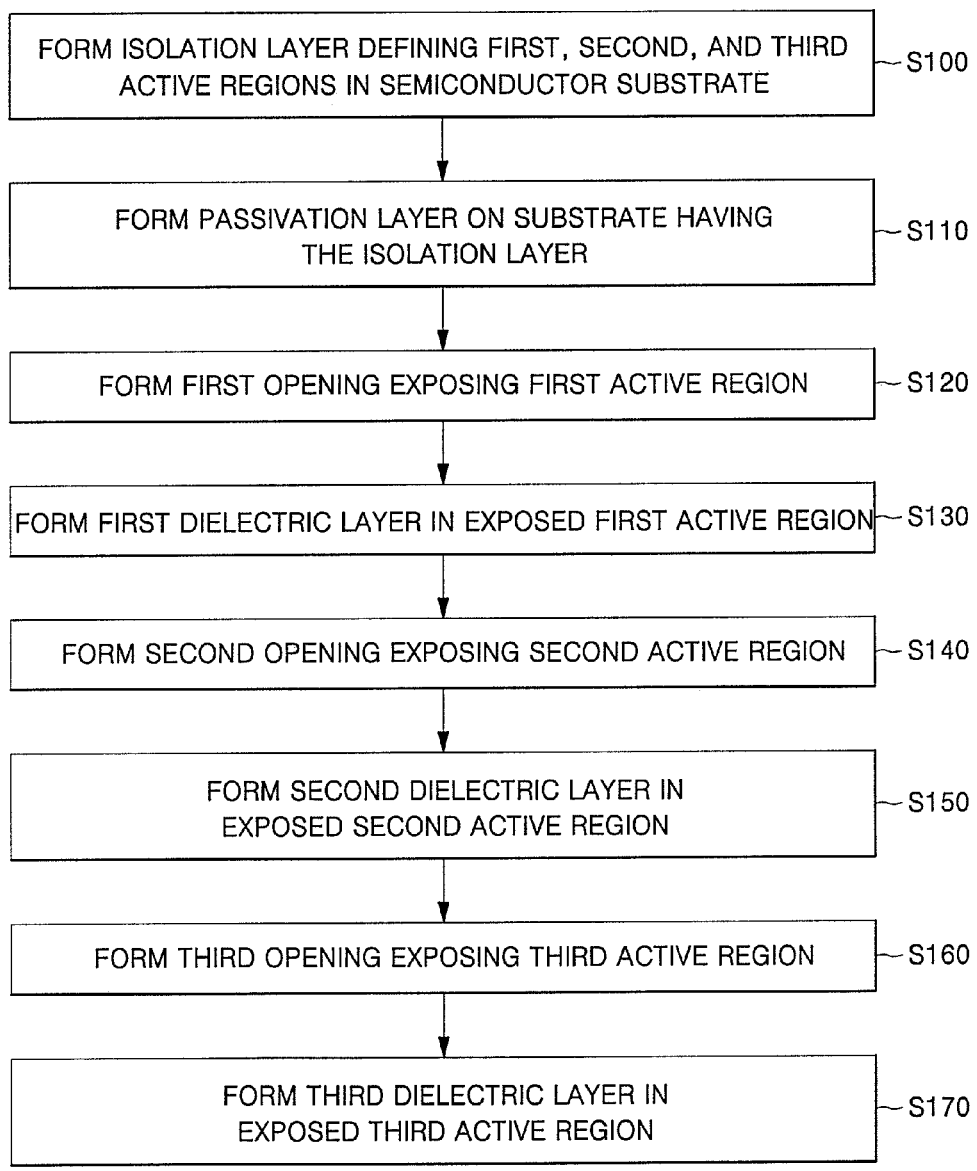
FIG. 6 is a flow chart illustrating a method of fabricating a semiconductor device in accordance with an exemplary embodiment of the present invention.

FIGS. 2A to 2G are cross-sectional views illustrating a method of fabricating a semiconductor device in accordance with an exemplary embodiment of the present invention, FIG. 3 is a cross-sectional view illustrating a method of fabricating a semiconductor device in accordance with an exemplary embodiment of the present invention, FIGS. 4A to 4C are cross-sectional views illustrating a method of fabricating a semiconductor device in accordance with an exemplary embodiment of the present invention, FIGS. 5A to 5D are cross-sectional views illustrating a method of fabricating a semiconductor device in accordance with an exemplary embodiment of the present invention, and FIG. 6 is a flow chart illustrating a method of fabricating a semiconductor device in accordance with exemplary embodiments of the present invention. Referring to FIGS. 2A to 2G, FIG. 3, FIGS.

4A to 4C, and FIGS. 5A to 5D, reference symbol C1 denotes a first circuit region and reference symbol C2 denotes a second circuit region.

A method of fabricating a semiconductor device according to an exemplary embodiment of the present invention will now be described with reference to FIGS. 2A to 2G.

Referring to FIG. 2A, a hard mask 110 may be formed on a semiconductor substrate 100 having a first circuit region C1 and a second circuit region C2. The first circuit region C1 may be a high-voltage MOS transistor region, and the second circuit region C2 may be a low-voltage MOS transistor region. The second circuit region C2 may also correspond to a cell array region. The hard mask 110 may be formed to include a silicon nitride layer. Before the hard mask 110 is formed, a pad oxide layer 105 may be formed on the semiconductor substrate 100. The pad oxide layer 105 may be a thermal oxide layer formed by a thermal oxidation process.

The semiconductor substrate 100 may be etched using the hard mask 110 as an etch mask to form a trench region 115. In this exemplary embodiment, a first active region A1 of the first circuit region C1 and a second active region A2 of the second circuit region C2 may be defined by the trench region 115.

A buffer insulating layer 120 and an insulating liner 125 may be formed to sequentially cover an inner wall of the trench region 115. The buffer insulating layer 120 is formed to cure etch damage applied to the semiconductor substrate 100 while the trench region 115 is formed. The buffer insulating layer 120 may be formed by thermally oxidizing the substrate having the isolation trench region. The insulating liner 125 may be formed of a silicon nitride layer by CVD. The semiconductor substrate of the inner wall of the trench region 115, and in particular, sidewalls of the active regions A1 and A2 are prevented from being oxidized due to subsequent thermal processes for forming the semiconductor device, which is why the insulating liner 125 is formed. In addition, the insulating liner 125 acts to prevent surfaces of the active regions A1 and A2 from being damaged due to plasma generated while an isolation layer to be described later is formed of a high-density plasma oxide layer.

An isolation layer may be formed on the substrate having the insulating liner 125. The insulating layer is planarized until the top surface of the hard mask 110 is exposed to form an isolation layer 130 filling the trench region 115. The isolation layer 130 may be formed of a high-density plasma oxide layer.

Referring to FIG. 2B, the hard mask (110 of FIG. 2A) is removed. The hard mask 110 may be removed by a wet etching process using a chemical solution containing phosphoric acid. A center portion of the hard mask 110 is first etched and a lower edge portion of the hard mask 110 is etched later while the hard mask 110 is etched. Accordingly, the hard mask 110 is over-etched to remove up to the lower edge portion thereof. The hard mask 110 and the insulating liner 125 are formed of a silicon nitride layer, so that some of the insulating liner 125 can be etched to form a first recessed region R1 in the first circuit region C1 and a second recessed region R2 in the second circuit region C2, while the hard mask 110 is removed.

Referring to FIG. 2C, a passivation layer 135 is formed on the substrate having the first and second recessed regions R1 and R2 shown in FIG. 2B. The passivation layer 135 may cover the entire surface of the substrate, while filling the first and second recessed regions R1 and R2. The passivation layer 135 may be formed of a material having an etch selectivity with respect to the isolation layer 130. For example, when the isolation layer 130 is formed of a silicon oxide layer, the passivation layer 135 may be formed of a silicon nitride layer.

Alternatively, the passivation layer 135 may be partially etched in order to reduce the thickness of the passivation layer 135. Accordingly, the passivation layer 135 may thinly cover the entire surface of the substrate while filling the first and second recessed regions R1 and R2.

A first ion implantation mask 139 having an opening exposing the first active region A1 may be formed on the substrate having the passivation layer 135. The first ion implantation mask 139 may be formed of a photoresist layer. A first ion implantation process 140 may be carried out on the substrate having the first ion implantation mask 139. The first ion implantation process 140 may include at least one of a well ion implantation process and an ion implantation process for adjusting the threshold voltage. Accordingly, a first well region 140w may be formed in the first active region A1. When the ion implantation process for adjusting the threshold voltage is used for the first ion implantation process 140, a threshold voltage adjustment region may be formed in the first active region A1.

Alternatively, the first ion implantation process 140 may be carried out before the passivation layer 135 is formed.

Referring to FIG. 2D, the first ion implantation mask 139 may be removed. The method of forming the first well region 140w in the first active region A1 may be employed to form a second well region 145w in the second active region A2. That is, a second ion implantation mask for opening an upper portion of the second active region A2 is formed, a second ion implantation process is carried out on the substrate having the second ion implantation mask, and then the second ion implantation mask may be removed.

Subsequently, a first patterning process may be carried out that selectively exposes the top surface of the first active region A1 and forms a first passivation pattern 135a between the first active region A1 and the isolation layer 130. Specifically, a first photoresist pattern 150 for opening an upper portion of the first active region A1 may be formed. The passivation layer 135 and the pad oxide layer 105 on the first active region A1 may be sequentially etched using the first photoresist pattern 150 as an etch mask. As a result, a first opening 150a exposing the surface of the first active region A1 may be formed. The passivation layer 135 may remain in the first recessed region R1 to form the first passivation pattern 135a.

A sidewall of the isolation layer 130 disposed at a level higher than the surface of the first active region A1 may be partially etched while the pad oxide layer 105 is etched. In addition, the isolation layer 130 disposed at a level lower than the surface of the first active region A1 may be protected by the first passivation pattern 135a while the pad oxide layer 105 is etched. Accordingly, the first opening 150a may be formed to expose the surface of the first active region A1 and to have a width larger than the width of the first active region A1 without causing dent regions.

Before the pad oxide layer 105 is etched, impurity ions for adjusting the threshold voltage may be implanted into the first active region A1 using the first photoresist pattern 150 as an ion implantation mask. As a result, a first threshold voltage adjustment region 151v may be formed in the first active region A1.

Alternatively, the first threshold voltage adjustment region 151v may be formed before the passivation layer 135 is etched using the first photoresist pattern 150 as an etch mask.

Referring to FIG. 2E, the first photoresist pattern 150 may be removed. Subsequently, a first dielectric layer 155 may be formed on the exposed surface of the first active region A1.

The first dielectric layer 155 may be a thermal oxide layer formed by a thermal oxidation process.

Alternatively, the first dielectric layer 155 may be a first high-k dielectric layer formed by CVD or atomic layer deposition (ALD). The first high-k dielectric layer may be formed of an aluminum oxide (AlO) layer, a hafnium oxide (HfO) layer, a zirconium oxide (ZrO) layer, a lanthanum oxide (LaO) layer, a hafnium silicon oxide (HfSiO) layer, a hafnium aluminum oxide (HfAlO) layer, a titanium oxide (TiO) layer, a tantalum oxide is (TaO) layer, or a stacked layer of selected ones of these layers. When the first dielectric layer 155 is formed of the first high-k dielectric layer, the first dielectric layer 155 may cover not only the exposed surface of the first active region A1 but also the entire surface of the substrate.

Referring to FIG. 2F, a second patterning process may be carried out on the substrate having the first dielectric layer 155 that selectively exposes the top surface of the second active region A2 and forms a second passivation pattern 135b between the second active region A2 and the isolation layer 130. Specifically, a second photoresist pattern 160 for opening an upper portion of the second active region A2 may be formed on the substrate having the first dielectric layer 155. The passivation layer 135 and the pad oxide layer 105 on the second active region A2 may be sequentially etched using the second photoresist pattern 160 as an etch mask. As a result, a second opening 160a exposing the surface of the second active region A2 may be formed. The passivation layer 135 may remain in the second recessed region R2 to form the second passivation pattern 135b. In addition, the passivation layer 135 may remain on the isolation layer 130 to leave a third passivation pattern 135c. The third passivation pattern 135c can act to prevent the top surface of the isolation layer 130 from being lowered due to subsequent processes.

Meanwhile, before the pad oxide layer 105 is etched, impurity ions for adjusting the threshold voltage may be implanted into the second active region A2 using the second photoresist pattern 160 as an ion implantation mask. As a result, a second threshold voltage adjustment region 161v may be formed in the second active region A2.

Alternatively, the second threshold voltage adjustment region 161v may be formed before the passivation layer 135 is etched using the second photoresist pattern 160 as an etch mask.

Since the second threshold voltage adjustment region 161v is formed before the first dielectric layer 155 is formed, thermal distribution of the second threshold voltage adjustment region 161v can be prevented from occurring due to the formation of the first dielectric layer 155.

Alternatively, a well ion implantation process may be carried out on the second active region A2 while the second threshold voltage adjustment region 161v is formed.

Referring to FIG. 2G, the second photoresist pattern 160 may be removed. A second dielectric layer 165 is then formed on the exposed surface of the second active region A2. The second dielectric layer 165 may be formed of a thermal oxide layer having a thickness smaller than the first dielectric layer 155. The thickness of the first dielectric layer 155 remaining in the first circuit region C1 is not significantly changed while the second dielectric layer 165 is formed. This is because an oxidation rate of the semiconductor substrate 100 in the first circuit region C1 is very slow due to the presence of the first dielectric layer 155.

A first gate pattern 170a covering the first dielectric layer 155 and crossing over the first active region A1 of the first circuit region C1 may be formed on the substrate having the second dielectric layer 165, and a second gate pattern 170b covering the second dielectric layer 165 and crossing over the second active region A2 of the second circuit region C2 may be formed on the substrate having the second dielectric layer 165. The first and second gate patterns 170a and 170b may be formed by photolithography and etching processes. The passivation layer 135 of the present invention can prevent the top surface of the isolation layer 130 from being recessed while gate dielectric layers having various thicknesses are formed. Accordingly, the top surface of the isolation layer 130 is not recessed, even when the thickness of the hard mask (110 of FIG. 1A) for forming the isolation layer 130 is reduced, which is different from the conventional art. Therefore, an exemplary embodiment of the present invention can use a thinner hard mask compared to a conventional hard mask used in the prior art. As a result, a step between the isolation layer 130 and the active regions A1 and A2 can be minimized, so that photoresist pattern defects can be prevented from occurring while the photolithography process for forming the first and second gate patterns 170a and 170b is being carried out.

The second dielectric layer 165 may be a second high-k dielectric layer formed by CVD or ALD. The second high-k dielectric layer may be formed of an AlO layer, an HfO layer, a ZrO layer, an LaO layer, an HfSiO layer, an HfAlO layer, a TiO layer, a TaO layer, or a stacked layer of selected ones of these layers. When the second dielectric layer 165 is formed of the second high-k dielectric layer, the second dielectric layer 165 may cover not only the exposed surface of the second active region A2 but also the surface of the first dielectric layer 155, which is different from what is shown in FIG. 2G. Accordingly, the thermal oxide layer and the second high-k dielectric layer may be sequentially stacked on the surface of the first active region A1 in the first circuit region C1, and the second high-k dielectric layer may be formed on the surface of the second active region A2 in the second circuit region C2.

When the first dielectric layer 155 is formed of the first high-k dielectric layer instead of the thermal oxide layer and the second dielectric layer 165 is formed of the second high-k dielectric layer, the first high-k dielectric layer and the second high-k dielectric layer may be sequentially stacked on the surface of the first active region A1 in the first circuit region C1, and the second high-k dielectric layer may be formed on the surface of the second active region A2 in the second circuit region C2. As such, the resultant structure that the first high-k dielectric layer 155 and the second high-k dielectric layer 165 are formed by CVD or ALD instead of thermal oxide layers is shown in FIG. 3.

Referring to FIG. 3, a first dielectric layer 1155 and a second dielectric layer 1165 are sequentially stacked on the first active region A1, and the second dielectric layer 1165 is formed on the second active region A2. The first dielectric layer 1155 may be formed of the first high-k dielectric layer, and the second dielectric layer 1165 may be formed of the second high-k dielectric layer. A first gate pattern 1170a crossing over the first active region A1 and a second gate pattern 1170b crossing over the second active region A2 may be formed.

Hereinafter, a semiconductor device fabricated according to an exemplary embodiment of the present invention will be described.

Referring again to FIG. 2G, a semiconductor substrate 100 has a first circuit region C1 and a second circuit region C2. An isolation layer 130 is formed in predetermined regions of the semiconductor substrate 100 to define a first active region A1 in the first circuit region C1 and a second active region A2 in the second circuit region C2. The isolation layer 130 may be disposed at a level higher than surfaces of the first and second active regions A1 and A2.

A first passivation pattern 135a and a second passivation pattern 135b may be interposed between an upper region of the first active region A1 and the isolation layer 130 and between an upper region of the second active region A2 and the isolation layer 130, respectively. An insulating liner 125 may be disposed at a level lower than the first and second passivation patterns 135a and 135b and may be interposed between the isolation layer 130 and the first and second active regions A1 and A2. The first and second passivation patterns 135a and 135b and the insulating liner 125 may be formed as material layers having the same etch rate. For example, the first and second passivation patterns 135a and 135b and the insulating liner 125 may be formed of silicon nitride layers. The first and second passivation patterns 135a and 135b may be formed of a material layer having an etch selectivity with respect to the isolation layer 130. For example, the isolation layer 130 may be formed of a silicon oxide layer, and the first and second passivation patterns 135a and 135b may be formed of silicon nitride layers.

A buffer insulating layer 120 may be interposed between the insulating liner 125 and the first and second active regions A1 and A2 and between the first and second passivation patterns 135a and 135b and the first and second active regions A1 and A2. The buffer insulating layer 120 may be formed of a thermal oxide layer.

A third passivation pattern 135c may be disposed on the isolation layer 130. The third passivation pattern 135c may be formed of the same material as the first and second passivation patterns 135a and 135b. The third passivation pattern 135c can act to protect the isolation layer 130 from being acted upon by subsequent processes.

The first active region A1 is covered by a first dielectric layer 155. In the same way, the second active region A2 is covered by a second dielectric layer 165 having a smaller thickness than the first dielectric layer 155. The first and second dielectric layers 155 and 165 may comprise thermal oxide layers. A first gate pattern 170a is disposed to cross over the first active region A1 and cover the first dielectric layer 155. A second gate pattern 170b is disposed to cross over the second active region A2 and cover the second dielectric layer 165. The first dielectric layer 155 can act as a gate dielectric layer of a high-voltage MOS transistor, and the second dielectric layer 165 can act as a gate dielectric layer of a low-voltage MOS transistor. The first gate pattern 170a can act as a gate electrode of the high-voltage MOS transistor, and the second gate pattern 170b can act as a gate electrode of the low-voltage MOS transistor.

As shown in FIG. 3, the first dielectric layer 1155 and the second dielectric layer 1165 may be sequentially stacked on the first active region A1, and the second dielectric layer 1165 may be disposed on the second active region A2. The first dielectric layer 1155 may be formed of a thermal oxide layer or a first high-k dielectric layer, and the second dielectric layer 1165 may be formed of a second high-k dielectric layer. Each of the first and second high-k dielectric layers may be formed of an AlO layer, an HfO layer, a ZrO layer, an LaO layer, an HfSiO layer, an HfAlO layer, a TiO layer, a TaO layer, or a stacked layer of selected ones of these layers.

Accordingly, dent regions are not generated in upper edge regions of the isolation layer 130. Therefore, hump and the reverse narrow width effect of the MOS transistor can be prevented from occurring, so that the reliability of the semiconductor device can be enhanced.

FIGS. 4A to 4C are cross-sectional views illustrating a method of fabricating a semiconductor device in accordance with an exemplary embodiment of the present invention. The present exemplary embodiment employs substantially the same method steps as the method of fabricating the semiconductor device corresponding to FIGS. 2A to 2C in accordance with the exemplary embodiment of the present invention. Accordingly, the method steps used in fabricating the semiconductor device corresponding to those explained in connection with FIGS. 2A to 2C will be omitted.

Referring to FIG. 4A, the first ion implantation mask 139 may be removed from the substrate in the steps carried out up to the first ion implantation process 140. Subsequently, the second well region 145w may be formed in the second active region A2. A first photoresist pattern 250 covering the second circuit region C2 and having a first opening 250a exposing the first circuit region C1 may be formed on the substrate where the second well region 145w is formed in the second active region A2. Subsequently, the first passivation layer 135 of the first circuit region C1 may be etched using the first photoresist pattern 250 as an etch mask. As a result, a first passivation pattern 235a may be formed in the first recessed region R1 while the isolation layer 130 and the pad oxide layer 105 on the first active region A1 are exposed. Subsequently, the exposed pad oxide layer 105 on the first active region A1 may be etched using the first photoresist pattern 250 as an etch mask while the isolation layer 130 is partially etched. As a result, the surface of the first active region A1 may be exposed. In addition, the isolation layer 130 of the first circuit region C1 may have a top surface disposed at substantially the same level as the surface of the first active region A1.

Before the pad oxide layer 105 of the first circuit region C1 is etched, impurity ions for adjusting the threshold voltage may be implanted into the first active region A1 using the first photoresist pattern 250 as an ion implantation mask. As a result, a first threshold voltage adjustment region 251v may be formed in the first active region A1.

Alternatively, the first threshold voltage adjustment region 251v may be formed before the passivation layer 135 is etched using the first photoresist pattern 250 as an etch mask.

Referring to FIG. 4B, the first photoresist pattern (250 of FIG. 4A) may be removed. Subsequently, a first dielectric layer 255 may be formed on the exposed surface of the first active region A1. The first dielectric layer 255 may be a thermal oxide layer formed by a thermal oxidation process.

Alternatively, the first dielectric layer 255 may be a first high-k dielectric layer formed by CVD or ALD. The first high-k dielectric layer may be formed of an AlO layer, an HfO layer, a ZrO layer, an LaO layer, an HfSiO layer, an HfAlO layer, a TiO layer, a TaO layer, or a stacked layer of selected ones of these layers. When the first dielectric layer 255 is formed of the first high-k dielectric layer, the first dielectric layer 255 may cover not only the exposed surface of the first active region A1 but also the entire surface of the substrate, which is different from what is shown in FIG. 4B.

A second photoresist pattern 260 having a second opening 260a exposing the second circuit region C2 may be formed on the substrate having the first dielectric layer 255. The passivation layer 135 on the second active region A2 may be etched using the second photoresist pattern 260 as an etch mask. In this case, the passivation layer 135 may remain in the second recessed region R2 to form a second passivation pattern 235b. Subsequently, the pad oxide layer 105 of the second circuit region C2 may be wet-etched using the second photoresist pattern 260 as an etch mask to expose the surface of the second active region A2.

The isolation layer 130 of the second circuit region C2 may be partially etched while the pad oxide layer 105 of the second circuit region C2 is wet-etched. As a result, the isolation layer 130 of the second circuit region C2 may have a top surface disposed at substantially the same level as the surface of the second active region A2.

Before the pad oxide layer 105 of the second circuit region C2 is etched, impurity ions for adjusting the threshold voltage may be implanted into the second active region A2 using the second photoresist pattern 250 as an ion implantation mask. As a result, a second threshold voltage adjustment region 261v may be formed in the second active region A2.

Alternatively, the second threshold voltage adjustment region 261v may be formed before the passivation layer 135 is etched using the second photoresist pattern 260 as an etch mask.

Referring to FIG. 4C, the second photoresist pattern 260 may be removed. Subsequently, a second dielectric layer 265 may be formed on the exposed surface of the second active region A2. The second dielectric layer 265 may be formed of a thermal oxide layer having a smaller thickness than the first dielectric layer 255.

Alternatively, the second dielectric layer 265 may be a second high-k dielectric layer formed by CVD or ALD. The second dielectric layer 265 may be formed of an AlO layer, an HfO layer, a ZrO layer, an LaO layer, an HfSiO layer, an HfAlO layer, a TiO layer, a TaO layer, or a stacked layer of selected ones of these layers. When the second dielectric layer 265 is formed of the second high-k dielectric layer, the second dielectric layer 265 may cover not only the exposed surface of the second active region A2 but also the surface of the first dielectric layer 255, which is different from what is shown in FIG. 4C. Accordingly, the thermal oxide layer and the second high-k dielectric layer may be sequentially stacked on the surface of the first active region A1 in the first circuit region C1, and the second high-k dielectric layer may be formed on the surface of the second active region A2 in the second circuit region C2.

Alternatively, when the first dielectric layer 255 is formed of the first high-k dielectric layer instead of the thermal oxide layer and the second dielectric layer 265 is formed of the second high-k dielectric layer, the first high-k dielectric layer and the second high-k dielectric layer may be sequentially stacked on the surface of the first active region A1 in the first circuit region C1, and the second high-k dielectric layer may be formed on the surface of the second active region A2 in the second circuit region C2.

A first gate pattern 270a crossing over the first active region A1 and covering the first dielectric layer 255, and a second gate pattern 270b crossing over the second active region A2 and covering the second dielectric layer 265 may be formed on the substrate having the second dielectric layer 265.

FIGS. 5A to 5D are cross-sectional views illustrating a method of fabricating a semiconductor device in accordance with an exemplary embodiment of the present invention. The present exemplary embodiment employs substantially the same method steps as the method of fabricating the semiconductor device corresponding to FIGS. 2A to 2C in accordance with the exemplary embodiment of the present invention. Accordingly, the method steps used in fabricating the semiconductor device corresponding to those explained in connection with FIGS. 2A to 2C will be omitted.

Referring to FIG. 5A, the first ion implantation mask 139 may be removed from the substrate in the process carried out up to the first ion implantation process 140. Subsequently, a second well region 145w may be formed in the second active region A2, and then a first patterning process of leaving the passivation layer 135 in the first recessed region R1 may be carried out. Specifically, a first photoresist pattern 350 covering the second circuit region C2 and having a first opening 350a exposing the first circuit region C1 may be formed on the substrate having the second well region 145w. Subsequently, the first passivation layer 135 of the first circuit region C1 may be anisotropically etched using the first photoresist pattern 350 as an etch mask. As a result, a first sidewall spacer 335a may be formed, that fills the first recessed region R1 and covers the sidewall of the protrusion of the isolation layer 130 disposed at a level higher than the surface of the first active region A1. Subsequently, the pad oxide layer 105 on the first active region A1 may be wet-etched using the first photoresist pattern 350 and the first sidewall spacer 335a as etch masks to expose the surface of the first active region A1. The isolation layer 130 of the first circuit region C1 may be partially etched and the surface of the first active region A1 may be cleaned while the pad oxide layer 105 on the first active region A1 is wet-etched. As a result, the isolation layer 130 of the first circuit region C1 may have a top surface disposed at substantially the same level as the surface of the first active region A1.

Before the pad oxide layer 105 of the first circuit region C1 is etched, impurity ions for adjusting the threshold voltage may be implanted into the first active region A1 using the first photoresist pattern 350 as an ion implantation mask. As a result, a first threshold voltage adjustment region 351v may be formed in the first active region A1.

Alternatively, the first threshold voltage adjustment region 351v may be formed before the passivation layer 135 is etched using the first photoresist pattern 350 as an etch mask.

Referring to FIG. 5B, the first sidewall spacer 335a shown in FIG. 5A may be wet-etched. In this case, the first sidewall spacer 335a may remain in the first recessed region R1 to form a first passivation pattern 336a shown in FIG. 5B.

Referring to FIG. 5C, the first photoresist pattern 350 shown in FIG. 5B may be removed. Subsequently, a second patterning process of leaving the passivation layer 135 shown in FIG. 5B in the second recessed region R2 may be carried out. Specifically, a second photoresist pattern 360 covering the first circuit region C1 and having a second opening 360a exposing the second circuit region C2 may be formed. Subsequently, the first passivation layer 135 of the second circuit region C2 may be anisotropically etched using the second photoresist pattern 360 as an etch mask. As a result, a second sidewall spacer may be formed that fills the second recessed region R2 and covers the sidewall of the protrusion of the isolation layer disposed at a level higher than the surface of the second active region A2. Subsequently, the pad oxide layer 105 on the second active region A2 may be wet-etched using the second photoresist pattern 360 and the second sidewall spacer as etch masks to expose the surface of the second active region A2. The isolation layer 130 of the second circuit region C2 may be partially etched and the surface of the second active region A2 may be cleaned while the pad oxide layer 105 on the second active region A2 is wet-etched. As a result, the isolation layer 130 of the second circuit region C2 may have a top surface disposed at substantially the same level as the surface of the second active region A2. The second sidewall spacer may be wet-etched. In this case, the second sidewall spacer may remain in the first recessed region R1 to form a second passivation pattern 336b.

Before the pad oxide layer 105 of the second circuit region C2 is etched, impurity ions for adjusting threshold voltage may be implanted into the second active region A2 using the second photoresist pattern 360 as an ion implantation mask. As a result, a second threshold voltage adjustment region 361v may be formed in the second active region A2.

Alternatively, the second threshold voltage adjustment region 361v may be formed before the first passivation layer 135 is anisotropically etched using the second photoresist pattern 360 as an etch mask.

Referring to FIG. 5D, the second photoresist pattern 360 shown in FIG. 5C may be removed. Subsequently, a second dielectric layer 365 may be formed on the exposed surface of the second active region A2. The second dielectric layer 365 may be formed of a thermal oxide layer having a smaller thickness than the first dielectric layer 355. Alternatively, the second dielectric layer 365 may be a second high-k dielectric layer formed by CVD or ALD. The second high-k dielectric layer may be formed of an AlO layer, an HfO layer, a ZrO layer, an LaO layer, an HfSiO layer, an HfAlO layer, a TiO layer, a TaO layer, or a stacked layer of selected ones of these layers. When the second dielectric layer 265 is formed of the second high-k dielectric layer, the second dielectric layer 265 may cover not only the exposed surface of the second active region A2 but also the surface of the first dielectric layer 355, which is different from what is shown in FIG. 5D. Accordingly, the thermal oxide layer and the second high-k dielectric layer may be sequentially stacked on the surface of the first active region A1 in the first circuit region C1, and the second high-k dielectric layer may be formed on the surface of the second active region A2 in the second circuit region C2.

Alternatively, when the first dielectric layer 355 is formed of the first high-k dielectric layer instead of the thermal oxide layer and the second dielectric layer 365 is formed of the second high-k dielectric layer, the first high-k dielectric layer and the second high-k dielectric layer may be sequentially stacked on the surface of the first active region A1 in the first circuit region C1, and the second high-k dielectric layer may be formed on the surface of the second active region A2 in the second circuit region C2.

A first gate pattern 370a crossing over the first active region A1 and covering the first dielectric layer 355, and a second gate pattern 370b crossing over the second active region A2 and covering the second dielectric layer 365 may be formed on the substrate having the second dielectric layer 365.

According to the above-described exemplary embodiments, a first gate dielectric layer is formed in a first active region of a first circuit region, and a second gate dielectric layer having a different thickness from the thickness of the first gate dielectric layer is formed in a second active region of a second circuit region. Exemplary embodiments of the present invention, however, are not limited to a semiconductor device having the first and second gate dielectric layers. Hereinafter, a method of fabricating a semiconductor device having at least three gate dielectric layers with different respective thicknesses will be described with reference to FIG. 6. The method of fabricating a semiconductor device according to the present exemplary embodiment is substantially similar to the method described with reference to FIGS. 2A to 2G, and thus a detailed description thereof will be omitted. FIG. 6 is a flow chart illustrating a method of fabricating a semiconductor device in accordance with exemplary embodiments of the present invention.

Referring to FIG. 6, an isolation layer may be formed in a semiconductor substrate to define first, second, and third active regions (S100). The process of forming the isolation layer is substantially the same as the process of forming the isolation layer 130 as described above with reference to FIG. 2A. In this exemplary embodiment, before the isolation layer is formed, the buffer insulating layer 120 and the insulating liner 125 may be formed, as described above with reference to FIG. 2A.

A passivation layer may be formed on the substrate having the isolation layer (S110). The passivation layer may be formed of a material layer having an etch selectivity with respect to the isolation layer.

A first opening exposing the first active region may be formed (S120). For example, the method of fabricating the semiconductor device described with reference to FIG. 2D may be employed for this operation. More specifically, formation of the first opening may include patterning the passivation layer using photolithography and etching processes to selectively expose the first active region. In this exemplary embodiment, the passivation layer may remain between the isolation layer and the first active region to form a first passivation pattern, while the first opening is formed.

A first dielectric layer may be formed in the exposed first active region (S130). The first dielectric layer may be a thermal oxide layer formed by a thermal oxidation process or may be a first high-k dielectric layer formed by CVD or ALD.

A second opening exposing the second active region may be formed (S140). Formation of the second opening may include patterning the passivation layer to selectively expose the second active region. In this case, the passivation layer may remain between the isolation layer and the second active region to form a second passivation pattern while the second opening is formed.

A second dielectric layer may be formed in the exposed second active region (S150). The second dielectric layer may be a thermal oxide layer formed by a thermal oxidation process or may be a second high-k dielectric layer formed by CVD or ALD. When each of the first and second dielectric layers is formed of the thermal oxide layer, the second dielectric layer may have a thickness smaller than the first dielectric layer. When the second dielectric layer is formed of the second high-k dielectric layer, the second dielectric layer may cover not only the surface of the second active region but also the surface of the first dielectric layer.

A third opening exposing the third active region may be formed (S160). Formation of the third opening may include patterning the passivation layer to selectively expose the third active region. In this case, the passivation layer may remain between the isolation layer and the third active region to form a third passivation pattern while the third opening is formed.

A third dielectric layer may be formed in the exposed third active region (S170). The third dielectric layer may be a thermal oxide layer formed by a thermal oxidation process or may be a second high-k dielectric layer formed by CVD or ALD. When the first, the second, and the third dielectric layers are formed of thermal oxide layers, the third dielectric layer may have a thickness smaller than the second dielectric layer. When the third dielectric layer is formed of the third high-k dielectric layer, the third dielectric layer may cover not only the surface of the third active region but also surfaces of the first and second dielectric layers. Each of the first, second, and third high-k dielectric layers may be formed of an AlO layer, an HfO layer, a ZrO layer, an LaO layer, an HfSiO layer, an HfAlO layer, a TiO layer, a TaO layer, or a stacked layer of selected ones of these layers.

Subsequently, a first gate pattern crossing over the first active region, a second gate pattern crossing over the second active region, and a third gate pattern crossing over the third active region may be formed.

Accordingly, a first gate dielectric layer having a first thickness may be formed between the first gate pattern and the first active region, a second gate dielectric layer having a second thickness smaller than the first thickness may be formed between the second gate pattern and the second active region, and a third gate dielectric layer having a third thickness may be formed between the third gate pattern and the third active region.

When the first, second, and third dielectric layers are formed of thermal oxide layers, the first gate dielectric layer may be formed of the first dielectric layer, the second gate dielectric layer may be formed of the second dielectric layer, and the third gate dielectric layer may be formed of the third dielectric layer. Alternatively, when the second and third dielectric layers are formed of second and third high-k dielectric layers, respectively, the first gate dielectric layer may be composed of the first dielectric layer, the second dielectric layer, and the third dielectric layer which are sequentially stacked, the second gate dielectric layer may be composed of the second dielectric layer and the third dielectric layer, which are sequentially stacked, and the third gate dielectric layer may be composed of the third dielectric layer.

According to exemplary embodiments of the present invention as described above, methods of fabricating a semiconductor device are provided, which can prevent dent regions from being formed in upper edge regions of an isolation layer while forming multiple gate dielectric layers. The semiconductor device having the multiple gate dielectric layers fabricated by such methods can prevent hump and the reverse narrow width effect from occurring, thereby enhancing reliability of the device.

Exemplary embodiments of the present invention have been disclosed herein and, although specific terms are employed, they are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
   forming an isolation layer defining first and second active regions in a semiconductor substrate, and forming a first recessed region between the isolation layer and an upper edge portion of the first active region and a second recessed region between the isolation layer and an upper edge portion of the second active region;
   forming a passivation layer on the semiconductor substrate having the isolation layer, the passivation layer filling the first second recessed regions;
   carrying out a first patterning process of etching the passivation layer on the first active region to form a first opening exposing the first active region, and forming a first passivation pattern in the first recessed region by the first patterning process, wherein the first passivation pattern is formed between a sidewall of the isolation layer and a sidewall of an upper edge portion of the first active region;
   forming a first dielectric layer in the exposed first active region;
   carrying out a second patterning process of etching the passivation layer on the second active region to form a second opening exposing the second active region, and forming a second passivation pattern in the second recessed region by the second patterning process, wherein the second passivation pattern is formed between a sidewall of the isolation layer and a sidewall of an upper edge portion of the second active region; and
   forming a second dielectric layer in the exposed second active region.

2. The method according to claim 1, wherein the second patterning process is carried out after the first dielectric layer is formed.

3. The method according to claim 1, wherein the first dielectric layer has a first thickness and the second dielectric layer has a second thickness smaller than the first thickness.

4. The method according to claim 1, wherein the first dielectric layer is one of a thermal oxide layer formed by thermal oxidation and a first high-k dielectric layer formed by chemical vapor deposition (CVD) or atomic layer deposition (ALD); the second dielectric layer is one of a thermal oxide layer formed by thermal oxidation and a second high-k dielectric layer formed by CVD or ALD; and when the second dielectric layer is formed of the second high-k dielectric layer, the second dielectric layer covers not only the exposed surface of the second active region but also the surface of the first dielectric layer.

5. The method according to claim 1, further comprising:
   before carrying out the first patterning process,
   carrying out at least one of a well ion implantation process and an ion implantation process for adjusting a threshold voltage on each of the first and second active regions.

6. The method according to claim 1, wherein the second patterning process comprises:
   forming a photoresist pattern on an upper portion of the second active region, on the substrate having the first dielectric layer;
   etching the passivation layer using the photoresist pattern as an etch mask; and
   removing the photoresist pattern.

7. The method according to claim 6, further comprising:
   before removing the photoresist pattern,
   carrying out an ion implantation process for adjusting threshold voltage on the second active region using the photoresist pattern as an ion implantation mask.

8. A method of fabricating a semiconductor device, comprising:
   forming a hard mask on first and second circuit regions of a semiconductor substrate;
   etching the semiconductor substrate using the hard mask as an etch mask to form a trench region, a first active region of the first circuit region and a second active region of the second circuit region being defined by the trench region;
   forming an insulating liner covering an inner wall of the trench region;
   forming an isolation layer filling the trench region on the semiconductor substrate having the insulating liner;
   removing the hard mask, a portion of the insulating liner being etched to form a first recessed region between the isolation layer and the first active region and a second recessed region between the isolation layer and the second active region while removing the hard mask;
   forming a passivation layer on the semiconductor substrate having the first and second recessed regions, the passivation layer filling the first and second recessed regions;
   carrying out a first patterning process of etching the passivation layer on the first active region to form a first opening exposing the first active region, a first passivation pattern being formed in the first recessed region by the first patterning process;
   forming a first dielectric layer in the exposed first active region;
   carrying out a second patterning process of etching the passivation layer on the second active region to form a second opening exposing the second active region, a second passivation pattern being formed in the second recessed region by the second patterning process; and forming a second dielectric layer in the exposed second active region.

9. The method according to claim 8, further comprising:
before forming the insulating liner,
forming a buffer insulating layer covering an inner wall of the trench region.

10. The method according to claim 8, wherein the first dielectric layer has a first thickness and the second dielectric layer has a second thickness smaller than the first thickness.

11. The method according to claim 8, wherein the first dielectric layer is one of a thermal oxide layer formed by thermal oxidation and a first high-k dielectric layer formed by chemical vapor deposition (CVD) or atomic layer deposition (ALD); the second dielectric layer is one of a thermal oxide layer formed by thermal oxidation and a second high-k dielectric layer formed by CVD or ALD; and when the second dielectric layer is formed of the second high-k dielectric layer, the second dielectric layer covers not only the exposed surface of the second active region but also the surface of the first dielectric layer.

12. The method according to claim 8, further comprising:
before carrying out the first patterning process,
carrying out at least one of a well ion implantation process and an ion implantation process for adjusting a threshold voltage on each of the first and second active regions.

13. The method according to claim 8, wherein the first patterning process comprises:
forming a first photoresist pattern opening the first circuit region on the passivation layer;
anisotropically etching the passivation layer on the first circuit region using the first photoresist pattern as an etch mask to form a first sidewall spacer, the first sidewall spacer filling the first recessed region and covering a sidewall of a protrusion of the isolation layer disposed at a level higher than the first active region;
partially etching the isolation layer using the first photoresist pattern and the first sidewall spacer as etch masks while cleaning the surface of the first active region;
etching the first sidewall spacer such that the first sidewall spacer remains in the first recessed region; and
removing the first photoresist pattern.

14. The method according to claim 8, wherein the second patterning process comprises:
forming a second photoresist pattern opening an upper portion of the second active region on the semiconductor substrate having the first dielectric layer;
etching the passivation layer on the second active region using the second photoresist pattern as an etch mask such that the passivation layer remains in the second recessed region; and
removing the second photoresist pattern.

15. The method according to claim 14, further comprising:
before removing the second photoresist pattern;
implanting ions for adjusting a threshold voltage into the second active region using the second photoresist pattern as an ion implantation mask.

16. The method according to claim 8, wherein the second patterning process comprises:
forming a second photoresist pattern opening the second circuit region on the semiconductor substrate having the first dielectric layer;
anisotropically etching the passivation layer on the second circuit region using the second photoresist pattern as an etch mask to form a second sidewall spacer, the second sidewall spacer filling the second recessed region and covering a sidewall of a protrusion of the isolation layer disposed at a level higher than the second active region;
partially etching the isolation layer using the second photoresist pattern and the second sidewall spacer as etch masks while cleaning the surface of the second active region;
etching the second sidewall spacer such that the second sidewall spacer remains in the second recessed region; and
removing the second photoresist pattern.

* * * * *